United States Patent
Tanaka et al.

(10) Patent No.: US 9,235,133 B2
(45) Date of Patent: Jan. 12, 2016

(54) LIGHTING OPTICAL DEVICE, REGULATION METHOD FOR LIGHTING OPTICAL DEVICE, EXPOSURE SYSTEM, AND EXPOSURE METHOD

(75) Inventors: Hirohisa Tanaka, Kamagaya (JP); Koji Shigematsu, Kawasaki (JP)

(73) Assignee: NIKON CORPORATION, Tokyo (JP)

( * ) Notice: Subject to any disclaimer, the term of this patent is extended or adjusted under 35 U.S.C. 154(b) by 766 days.

(21) Appl. No.: 11/660,387

(22) PCT Filed: Aug. 3, 2005

(86) PCT No.: PCT/JP2005/014166
§ 371 (c)(1),
(2), (4) Date: May 17, 2007

(87) PCT Pub. No.: WO2006/018972
PCT Pub. Date: Feb. 23, 2006

(65) Prior Publication Data
US 2008/0030707 A1    Feb. 7, 2008

(30) Foreign Application Priority Data
Aug. 17, 2004  (JP) ................................ 2004-236913

(51) Int. Cl.
*G03B 27/72*       (2006.01)
*G03B 27/54*       (2006.01)
(Continued)

(52) U.S. Cl.
CPC ........ *G03F 7/70108* (2013.01); *G02B 19/0014* (2013.01); *G02B 19/0047* (2013.01); *G03F 7/70133* (2013.01); *G03F 7/70191* (2013.01)

(58) Field of Classification Search
CPC ............ G03F 7/70091; G03F 7/70108; G03F 7/70125; G03F 7/70133; G03F 7/70191; G02B 19/0014; G02B 19/0047
USPC ........... 355/52, 53, 55, 67–71, 77; 250/492.1, 250/492.2, 492.22, 548; 356/399–401; 359/558, 619, 629; 362/16, 268, 277
See application file for complete search history.

(56) References Cited

U.S. PATENT DOCUMENTS 5,715,089 A * 2/1998 Shiraishi ........................ 359/558
5,798,824 A * 8/1998 Kudo .............................. 355/67
(Continued)

FOREIGN PATENT DOCUMENTS

DE   102 18 989 A1   11/2003
EP   0 952 491 A2    10/1999
(Continued)

OTHER PUBLICATIONS

Dec. 28, 2011 Response to Opposition issued in European Patent Application No. 05768370.8 (with translation).
(Continued)

*Primary Examiner* — Christina Riddle
(74) *Attorney, Agent, or Firm* — Oliff PLC

(57) ABSTRACT

An illumination optical apparatus is able to adjust each of pupil luminance distributions at respective points on a surface to be illuminated to being almost uniform, while maintaining or adjusting an illuminance distribution on the surface to be illuminated to being almost uniform. The illumination optical apparatus illuminates the surface to be illuminated (M, W), with a light beam from a light source (1). The apparatus is provided with a pupil distribution forming device (1-4) for forming a pupil luminance distribution with a predetermined luminance distribution on an illumination pupil plane; and an adjuster (8, 9) for independently adjusting each of pupil luminance distributions about respective points on the surface to be illuminated. The adjuster has a plurality of adjustment surfaces each of which is disposed in an optical path between the pupil distribution forming device and the surface to be illuminated and has a predetermined transmittance distribution or reflectance distribution.

28 Claims, 14 Drawing Sheets

(51) Int. Cl.
*G03B 27/68* (2006.01)
*G03F 7/20* (2006.01)
*G02B 19/00* (2006.01)
G03B 27/42 (2006.01)
G03B 27/32 (2006.01)

(56) References Cited

U.S. PATENT DOCUMENTS

| | | | |
|---|---|---|---|
| 5,867,319 A * | 2/1999 | Sugiyama et al. | 359/618 |
| 6,281,967 B1 * | 8/2001 | Kudo | 355/67 |
| 6,295,122 B1 * | 9/2001 | Schultz et al. | 355/67 |
| 6,366,341 B1 | 4/2002 | Shirato et al. | |
| 6,404,499 B1 * | 6/2002 | Stoeldraijer et al. | 356/400 |
| 6,583,855 B2 * | 6/2003 | Krikke et al. | 355/67 |
| 6,587,182 B1 * | 7/2003 | Goto | 355/71 |
| 6,665,050 B2 * | 12/2003 | Shiraishi | 355/53 |
| 6,704,090 B2 | 3/2004 | Nishi | |
| 6,771,350 B2 | 8/2004 | Nishinaga | |
| 7,102,728 B2 | 9/2006 | Matsuyama | |
| 2002/0036763 A1 * | 3/2002 | Krikke et al. | 355/67 |
| 2002/0154284 A1 | 10/2002 | Sato | |
| 2003/0025890 A1 | 2/2003 | Nishinaga | |
| 2003/0067591 A1 | 4/2003 | Komatsuda | |
| 2003/0206289 A1 | 11/2003 | Matsuyama | |
| 2004/0036977 A1 * | 2/2004 | Tanaka et al. | 359/619 |
| 2004/0070744 A1 | 4/2004 | Ozawa | |
| 2004/0133872 A1 | 7/2004 | Fukuhara et al. | |
| 2005/0117224 A1 | 6/2005 | Shafer et al. | |
| 2005/0140957 A1 | 6/2005 | Luijkx et al. | |
| 2006/0050261 A1 * | 3/2006 | Brotsack | 355/71 |
| 2006/0121364 A1 | 6/2006 | Omura | |
| 2007/0014112 A1 | 1/2007 | Ohya et al. | |
| 2008/0094599 A1 | 4/2008 | Scheible et al. | |
| 2008/0113281 A1 | 5/2008 | Maul et al. | |
| 2008/0291422 A1 | 11/2008 | Kremer | |
| 2009/0323043 A1 | 12/2009 | Dieckmann et al. | |

FOREIGN PATENT DOCUMENTS

| | | |
|---|---|---|
| JP | H3-065623 | 3/1991 |
| JP | A 3-216658 | 9/1991 |
| JP | A 6-124873 | 5/1994 |
| JP | A-07-066121 | 3/1995 |
| JP | A 9-190969 | 7/1997 |
| JP | A 10-303114 | 11/1998 |
| JP | 2002-100561 A | 4/2002 |
| JP | A-2003-092253 | 3/2003 |
| JP | A-2003-257812 | 9/2003 |
| JP | A-2004-126010 | 4/2004 |
| JP | A 2004-149698 | 5/2004 |
| WO | WO 99/49504 | 9/1999 |
| WO | WO 02/31570 A1 | 4/2002 |
| WO | WO 03/023832 A1 | 3/2003 |
| WO | WO 2004/019128 A2 | 3/2004 |
| WO | WO 2004/107011 A1 | 12/2004 |
| WO | WO 2005/048326 A1 | 5/2005 |
| WO | WO 2005/059617 A2 | 6/2005 |
| WO | WO 2005/119369 A1 | 12/2005 |
| WO | WO 2006/066638 A1 | 6/2006 |
| WO | WO 2008/092653 | 8/2008 |

OTHER PUBLICATIONS

Aug. 19, 2013 Office Action issued in Japanese Patent Application No. 2011-130751 (with translation).
May 17, 2013 Grounds of Appeal issued in European patent Application No. 1 798 758 B1 (with translation).
Apr. 23, 2013 Office Action issued in Japanese Patent Application No. 2011-130751 (with translation).
Jul. 3, 2014 Office Action issued in Taiwanese Patent Application No. 101128475 (with translation).
Sep. 16, 2010 Notice of Opposition issued in European Patent Application No. 05768370.8 (with translation).
Dec. 16, 2011 Letter from Opponent Opposition issued in European Patent Application No. 05768370.8 (with translation).
Jan. 8, 2013 Official minutes in oral proceedings issued in European Patent Application No. 05768370.8.
Aug. 7, 2012 Summon for Oral Proceedings with the Examiners comments issued in European Patent Application No. 05768370.8.
Jan. 8, 2013 Interlocutory Decision issued in European Patent Application No. 05768370.8.
May 17, 2013 Grounds of Appeal issued in European Patent Application No. 05768370.8 (with translation).
Nov. 21, 2013 Letter of the Opponent issued in European Patent Application No. 05768370.8 (with translation).
Feb. 12, 2015 Brief filed in European Application No. 05768370.
Apr. 23, 2010 Office Action issued in Japanese Application No. 2004-236913.
Jan. 5, 2010 Office Action issued in Japanese Application No. 2004-236913.
Nov. 10, 2011 Office Action issued in Japanese Application No. 2010-155578.
Feb. 6, 2015 Brief Submitted in European Application No. 05768370.8.

\* cited by examiner (a)

(b)

(a)

(b)

(a)

(b)

(c)

LIGHTING OPTICAL DEVICE, REGULATION METHOD FOR LIGHTING OPTICAL DEVICE, EXPOSURE SYSTEM, AND EXPOSURE METHOD

TECHNICAL FIELD

The present invention relates to an illumination optical apparatus, an adjustment method of illumination optical apparatus, an exposure apparatus, and an exposure method and, more particularly, to an illumination optical apparatus suitably applicable to exposure apparatus for manufacturing microdevices, such as semiconductor devices, image pickup devices, liquid-crystal display devices, and thin-film magnetic heads, by lithography.

BACKGROUND ART

In the typical exposure apparatus of this type, a light beam emitted from a light source is guided through a fly's eye lens (or microlens array) as an optical integrator to form a secondary light source as a substantive surface illuminant consisting of a lot of light sources. Light beams from the secondary light source are incident to a condenser lens.

The light beams converged by the condenser lens illuminate a mask with a predetermined pattern thereon in a superposed manner. Light having passed through the pattern of the mask travels through a projection optical system to form an image on a wafer. In this manner the mask pattern is projected (or transferred) onto the wafer as a photosensitive substrate to effect exposure thereof. The pattern formed on the mask is of high integration and a uniform illuminance distribution must be achieved on the wafer in order to accurately transfer this microscopic pattern onto the wafer.

Furthermore, attention is being focused on the technology of forming the secondary light source of circular shape on the rear focal plane of the fly's eye lens and changing the size thereof to vary the coherency σ of illumination (σ value=diameter of an aperture stop/pupil diameter of a projection optical system, or σ value=exit-side numerical aperture of an illumination optical system/entrance-side numerical aperture of the projection optical system). In addition, attention is also focused on the technology of forming the secondary light source of annular shape or quadrupole shape on the rear focal plane of the fly's eye lens to improve the depth of focus and resolving power of the projection optical system.

DISCLOSURE OF THE INVENTION

Problem to be Solved by the Invention

In this case, in order to accurately transfer the microscopic pattern of the mask onto the wafer, it is necessary to adjust a light intensity distribution of the secondary light source formed on the rear focal plane of the fly's eye lens, i.e., a pupil luminance distribution with a predetermined luminance distribution formed on the illumination pupil plane, to a desired shape and to adjust each of pupil luminance distributions about respective points on the wafer as a final surface to be illuminated to being almost uniform. If there is variation in uniformity of the pupil luminance distributions at respective points on the wafer, the line width of the pattern will vary depending upon positions on the wafer and it will result in failing to accurately transfer the microscopic pattern of the mask in a desired line width across an entire exposure region on the wafer.

An object of the present invention is to provide an illumination optical apparatus capable of adjusting each of pupil luminance distributions at respective points on a surface to be illuminated to being almost uniform, while maintaining or adjusting an illuminance distribution on the surface to be illuminated to being almost uniform. Another object of the present invention is to provide an exposure apparatus and exposure method capable of accurately transferring a microscopic pattern of a mask in a desired line width across an entire exposure region onto a photosensitive substrate, using an illumination optical apparatus capable of maintaining or adjusting an illuminance distribution on a surface to be illuminated to being almost uniform and capable of adjusting pupil luminance distributions at respective points on the surface to be illuminated to being almost uniform.

Means for Solving the Problem

In order to achieve the above object, a first aspect of the present invention provides an illumination optical apparatus for illuminating a surface to be illuminated, with a light beam from a light source, the illumination optical apparatus comprising:

pupil distribution forming means for forming a pupil luminance distribution with a predetermined luminance distribution on an illumination pupil plane; and an adjuster for independently adjusting each of pupil luminance distributions about respective points on the surface to be illuminated;

wherein the adjuster has a plurality of adjustment surfaces each of which is disposed in an optical path between the pupil distribution forming means and the surface to be illuminated, and wherein each of the adjustment surfaces outputs light with a light intensity distribution different from a light intensity distribution of incident light.

A second aspect of the present invention provides an illumination optical apparatus for illuminating a surface to be illuminated, with a light beam from a light source, the illumination optical apparatus comprising:

pupil distribution forming means for forming a pupil luminance distribution with a predetermined luminance distribution on an illumination pupil plane; and an adjuster for independently adjusting each of pupil luminance distributions about respective points on the surface to be illuminated;

wherein the adjuster has a plurality of adjustment surfaces each of which is disposed in an optical path between the pupil distribution forming means and the surface to be illuminated and has a predetermined transmittance distribution or reflectance distribution, and wherein the plurality of adjustment surfaces are located at respective positions different from each other along an optical-axis direction of the illumination optical apparatus.

A third aspect of the present invention provides an illumination optical apparatus for illuminating a surface to be illuminated, with a light beam from a light source, the illumination optical apparatus comprising:

a first adjustment surface disposed in an optical path between an illumination pupil plane of the illumination optical apparatus and the surface to be illuminated and in an optical path on the light source side with respect to a conjugate plane optically conjugate with the surface to be illuminated, and having a first transmittance distribution or first reflectance distribution of transmittances or reflectances different according to incidence positions; and a second adjustment surface disposed in the optical path between the illumination pupil plane and the surface to be illuminated and in an optical path on the surface-to-be-illuminated side with respect to the conjugate plane optically conjugate with the surface to be illuminated, and having a second transmittance distribution or second reflectance distribution of transmittances or reflectances different according to incidence positions.

A fourth aspect of the present invention provides an illumination optical apparatus for illuminating a surface to be illuminated, with a light beam from a light source, the illumination optical apparatus comprising:

a first adjustment surface disposed in an optical path between an illumination pupil plane of the illumination optical apparatus and the surface to be illuminated and in an optical path on the light source side with respect to a conjugate plane optically conjugate with the surface to be illuminated, and having a first transmittance distribution or first reflectance distribution of transmittances or reflectances different according to incidence angles; and a second adjustment surface disposed in the optical path between the illumination pupil plane and the surface to be illuminated and in an optical path on the surface-to-be-illuminated side with respect to the conjugate plane optically conjugate with the surface to be illuminated, and having a second transmittance distribution or second reflectance distribution of transmittances or reflectances different according to incidence angles.

A fifth aspect of the present invention provides an illumination optical apparatus for illuminating a surface to be illuminated, with a light beam from a light source, the illumination optical apparatus comprising:

a first adjustment surface disposed in an optical path between an illumination pupil plane of the illumination optical apparatus and the surface to be illuminated, and having a first transmittance distribution or first reflectance distribution of transmittances or reflectances different according to incidence positions; and a second adjustment surface disposed in the optical path between the illumination pupil plane and the surface to be illuminated, and having a second transmittance distribution or second reflectance distribution of transmittances or reflectances different according to incidence positions;

wherein a light beam size at a location where a light beam to arrive at a predetermined point on the surface to be illuminated passes through the first adjustment surface is different from a light beam size at a location where the light beam to arrive at the predetermined point on the surface to be illuminated passes through the second adjustment surface.

A sixth aspect of the present invention provides a method of adjusting the illumination optical apparatus of the first aspect to the fifth aspect, the adjustment method comprising:

a pupil luminance distribution calculating step of calculating pupil luminance distributions about a plurality of points on the surface to be illuminated, based on design data of the illumination optical apparatus;

a distribution determining step of determining required transmittance distributions or reflectance distributions to be given to the respective adjustment surfaces, in order to independently adjust each of the pupil luminance distributions about the plurality of points; and an adjustment step of forming and placing each of the plurality of adjustment surfaces with the respective required transmittance distributions or reflectance distributions.

A seventh aspect of the present invention provides a method of adjusting the illumination optical apparatus of the first aspect to the fifth aspect, the adjustment method comprising:

a pupil luminance distribution measuring step of measuring pupil luminance distributions about a plurality of points on the surface to be illuminated;

a distribution determining step of determining required transmittance distributions or reflectance distributions to be given to the respective adjustment surfaces, in order to independently adjust each of the pupil luminance distributions about the plurality of points; and an adjustment step of forming and placing each of the plurality of adjustment surfaces with the respective required transmittance distributions or reflectance distributions.

An eighth aspect of the present invention provides a method of adjusting the illumination optical apparatus of the first aspect to the fifth aspect, the adjustment method comprising:

a pupil luminance distribution acquiring step of acquiring pupil luminance distributions about a plurality of points on the surface to be illuminated;

an approximation step of approximating each of the pupil luminance distributions about the plurality of points acquired in the pupil luminance distribution acquiring step, by a predetermined polynomial as a function of pupil coordinates on the illumination pupil plane;

an evaluation step of evaluating the pupil luminance distributions about the plurality of points by a pupil luminance distribution polynomial as a function of image-plane coordinates and the pupil coordinates on the surface to be illuminated, based on coefficients of respective terms in the predetermined polynomial;

a step of obtaining a correlation between the transmittance distributions or reflectance distributions given to the respective adjustment surfaces and changes of the pupil luminance distributions about the plurality of points;

a distribution determining step of determining required transmittance distributions or reflectance distributions to be given to the respective adjustment surfaces, in order to independently adjust each of the pupil luminance distributions about the plurality of points, based on a result of the evaluation in the evaluation step and the correlation; and an adjustment step of forming and placing each of the plurality of adjustment surfaces with the respective required transmittance distributions or reflectance distributions.

A ninth aspect of the present invention provides a method of adjusting an illumination optical apparatus for forming a pupil luminance distribution with a predetermined luminance distribution on an illumination pupil plane on the basis of a light beam from a light source and for illuminating a surface to be illuminated, with a light beam from the pupil luminance distribution, the adjustment method comprising:

a pupil luminance distribution acquiring step of acquiring pupil luminance distributions about a plurality of points on the surface to be illuminated;

a distribution determining step of determining required transmittance distributions or reflectance distributions at a plurality of positions in an optical path of the illumination optical apparatus, in order to independently adjust each of the pupil luminance distributions about the plurality of points; and an adjustment step of forming each of a plurality of adjustment surfaces with the respective required transmittance distributions or reflectance distributions and placing the adjustment surfaces at the plurality of positions.

A tenth aspect of the present invention provides an exposure apparatus comprising the illumination optical apparatus of the first aspect to the fifth aspect, or an illumination optical apparatus adjusted by the adjustment method of the sixth aspect to the ninth aspect, the exposure apparatus being adapted for projecting a pattern of a mask illuminated by the illumination optical apparatus, onto a photosensitive substrate to effect exposure thereof.

An eleventh aspect of the present invention provides an exposure method comprising: an illumination step of illuminating a mask with the illumination optical apparatus of the first aspect to the fifth aspect, or with an illumination optical apparatus adjusted by the adjustment method of the sixth aspect to the ninth aspect; and an exposure step of projecting a pattern of the mask onto a photosensitive substrate to effect exposure thereof.

Effect of the Invention

The illumination optical apparatus of the present invention has the adjuster for independently adjusting each of the pupil luminance distributions about respective points on the surface to be illuminated, e.g., a plurality of adjustment surfaces each of which outputs light with a light intensity distribution different from that of incident light. Therefore, the operation of the plurality of adjustment surfaces which this adjuster comprises enables the apparatus to adjust each of the pupil luminance distributions at respective points on the surface to be illuminated to being almost uniform, while maintaining or adjusting the illuminance distribution on the surface to be illuminated to being almost uniform. The present invention also enables the apparatus to adjust each of the pupil luminance distributions at respective points on the surface to be illuminated, to a desired distribution while maintaining or adjusting the illuminance distribution on the surface to be illuminated, to a desired distribution.

Since the exposure apparatus and exposure method of the present invention use the illumination optical apparatus capable of maintaining or adjusting the illuminance distribution on the surface to be illuminated to being almost uniform and capable of adjusting the pupil luminance distributions at respective points on the surface to be illuminated to being almost uniform, they are able to accurately transfer a microscopic pattern of a mask in a desired line width across an entire exposure region onto a photosensitive substrate and, in turn, to manufacture good devices with high accuracy. The exposure apparatus and exposure method of the present invention are also able to accurately transfer the microscopic pattern of the mask in a desired line width across an entire exposure region onto the photosensitive substrate, by adjusting each of the pupil luminance distributions at respective points on the surface to be illuminated, to a desired distribution while maintaining or adjusting the illuminance distribution on the surface to be illuminated, to a desired distribution.

BEST MODES FOR CARRYING OUT THE INVENTION

Figure 1:
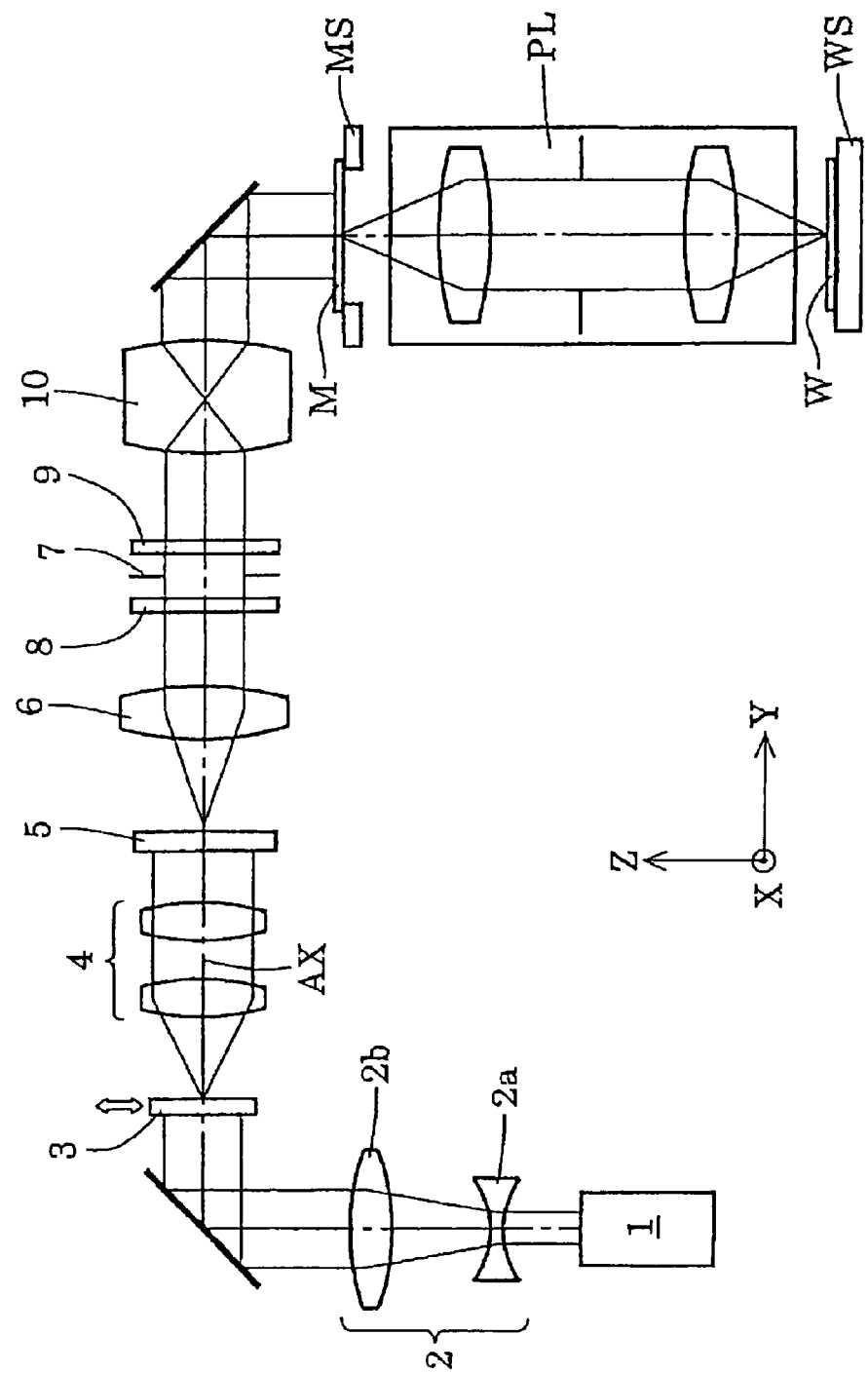
FIG. 1 is a drawing schematically showing an overall configuration of an exposure apparatus according to an embodiment of the present invention.

Embodiments of the present invention will be described based on the accompanying drawings. FIG. 1 is a drawing schematically showing an overall configuration of an exposure apparatus according to an embodiment of the present invention. In FIG. 1, the Z-axis is set along a direction of a normal to a wafer W being a photosensitive substrate, the Y-axis along a direction parallel to the paper of FIG. 1 in the surface of the wafer W, and the X-axis along a direction normal to the paper of FIG. 1 in the surface of the wafer W. In FIG. 1, the illumination optical apparatus is arranged to implement normal circular illumination.

With reference to FIG. 1, the exposure apparatus of the present embodiment is provided with a light source 1 for supplying exposure light (illumination light). The light source 1 used herein can be, for example, a KrF excimer laser light source for supplying light of the wavelength of 248 nm, an ArF excimer laser light source for supplying light of the wavelength of 193 nm, or the like. A nearly parallel light beam emitted along the +Z direction from the light source 1 has a cross section of a rectangular shape extending oblongly along the X-direction and is incident to a beam expander 2 consisting of a pair of lenses 2a and 2b.

The lenses 2a and 2b have a negative refracting power and a positive refracting power, respectively, in the paper of FIG. 1 (YZ plane). Therefore, the light beam incident to the beam expander 2 is expanded in the paper of FIG. 1 and shaped into a light beam having a cross section of a predetermined rectangular shape. The nearly parallel light beam having passed through the beam expander 2 as a shaping optical system is then deflected into the +Y direction by a path folding mirror and thereafter travels through a diffractive optical element 3 for circular illumination to enter a zoom lens 4. An entrance surface of a micro fly's eye lens 5 is positioned near the rear focal plane of the zoom lens 4.

In general, a diffractive optical element is constructed by forming steps at a pitch approximately equal to the wavelength of the exposure light (illumination light) in a substrate, and functions to diffract an incident light beam at desired angles. Specifically, the diffractive optical element 3 converts the parallel light beam of rectangular shape incident along the optical axis AX, into a divergent light beam having a cross section of a circular shape. The diffractive optical element 3 is arranged to be freely inserted into or retracted from the illumination optical path and to be replaceable with another diffractive optical element for annular illumination or diffractive optical element for quadrupole illumination.

The micro fly's eye lens 5 is an optical member comprising a lot of microscopic lenses (optical elements) arranged vertically and horizontally and densely. In general, a micro fly's eye lens is constructed, for example, by simultaneously forming a number of microscopic optical surfaces in a plane-parallel glass plate by applying the MEMS technology (lithography+etching, etc.). In this way, the light beam having passed through the diffractive optical element 3 travels through the zoom lens 4 to form, for example, a circular illumination field centered on the optical axis AX, on the entrance surface of the micro fly's eye lens 5 as an optical integrator of the wavefront splitting type.

The size of the circular illumination field formed herein (i.e., the diameter thereof) varies depending upon the focal length of the zoom lens 4. The light beam incident to the micro fly's eye lens 5 is two-dimensionally split by a lot of microscopic lenses and the split light beams form respective light sources on the rear focal plane of the microscopic lenses which the incident light beam enters. In this manner, a substantive surface illuminant of a circular shape (hereinafter referred to as a "secondary light source") having a light intensity distribution approximately equal to that of the circular illumination field formed by the incident light beam to the micro fly's eye lens 5 is formed on the rear focal plane of the micro fly's eye lens 5.

Light beams from the secondary light source of circular shape formed on the rear focal plane of the micro fly's eye lens 5 are subject to focusing operation of a condenser optical system 6 and thereafter illuminate a mask blind 7 disposed on a plane optically conjugate with a mask M (and the wafer W eventually), in a superposed manner. This results in forming an illumination field of a rectangular shape similar to the shape of each microscopic lens forming the micro fly's eye lens 5, on the mask blind 7. A first correction filter 8 is located in front of the mask blind 7 (on the light source side) and a second correction filter 9 is located behind the mask blind 7 (on the mask side). Configurations and operations of the first correction filter 8 and the second correction filter 9 will be described later.

The light beams having passed through an aperture (light transmitting portion) of a rectangular shape in the mask blind 7 are subject to focusing operation of an imaging optical system 10, are deflected into the −Z direction by a path folding mirror, and thereafter illuminate the mask M with a predetermined pattern formed thereon, in a superposed manner. In this way, the imaging optical system 10 forms an image of the rectangular aperture of the mask blind 7 on the mask M supported on a mask stage MS. Namely, the mask blind 7 constitutes a field stop for defining an illumination region formed on the mask M (and the wafer W eventually).

A light beam having passed through the pattern of the mask M travels through a projection optical system PL to form an image of the mask pattern on the wafer W being a photosensitive substrate. Namely, the pattern image is formed in a rectangular region on the wafer W supported on a wafer stage WS so as to correspond to the rectangular illumination field on the mask M. In this way, the pattern of the mask M is sequentially projected into each exposure area of the wafer W by performing one-shot exposure or scan exposure while two-dimensionally driving and controlling the wafer W in a plane (XY plane) perpendicular to the optical axis AX of the projection optical system PL.

It is noted that annular illumination can be implemented by setting a diffractive optical element for annular illumination instead of the diffractive optical element 3 in the illumination optical path. The diffractive optical element for annular illumination converts the parallel light beam of the rectangular shape incident along the optical axis AX, into a divergent light beam having a cross section of an annular shape. Therefore, the light beam having passed through the diffractive optical element for annular illumination forms, for example, an illumination field of an annular shape centered on the optical axis AX, on the entrance surface of the micro fly's eye lens 5. As a result, the secondary light source of the annular shape having the light intensity distribution approximately equal to that of the annular illumination field formed on the entrance surface is also formed on the rear focal plane of the micro fly's eye lens 5.

In addition, quadrupole illumination (generally, multi-pole illumination) can be implemented by setting a diffractive optical element for quadrupole illumination (generally, for multi-pole illumination including dipole, octupole, or other illumination) instead of the diffractive optical element 3 in the illumination optical path. The diffractive optical element for quadrupole illumination converts the parallel light beam of the rectangular shape incident along the optical axis AX, into divergent light beams having a cross section of a quadrupole, shape. Therefore, the light beams having passed through the diffractive optical element for quadrupole illumination form, for example, an illumination field of a quadrupole shape centered on the optical axis AX, on the entrance surface of the micro fly's eye lens 5. As a result, the secondary light source of the quadrupole shape having the light intensity distribution approximately equal to that of the quadrupole illumination field formed on the entrance surface is also formed on the rear focal plane of the micro fly's eye lens 5.

Figure 2:
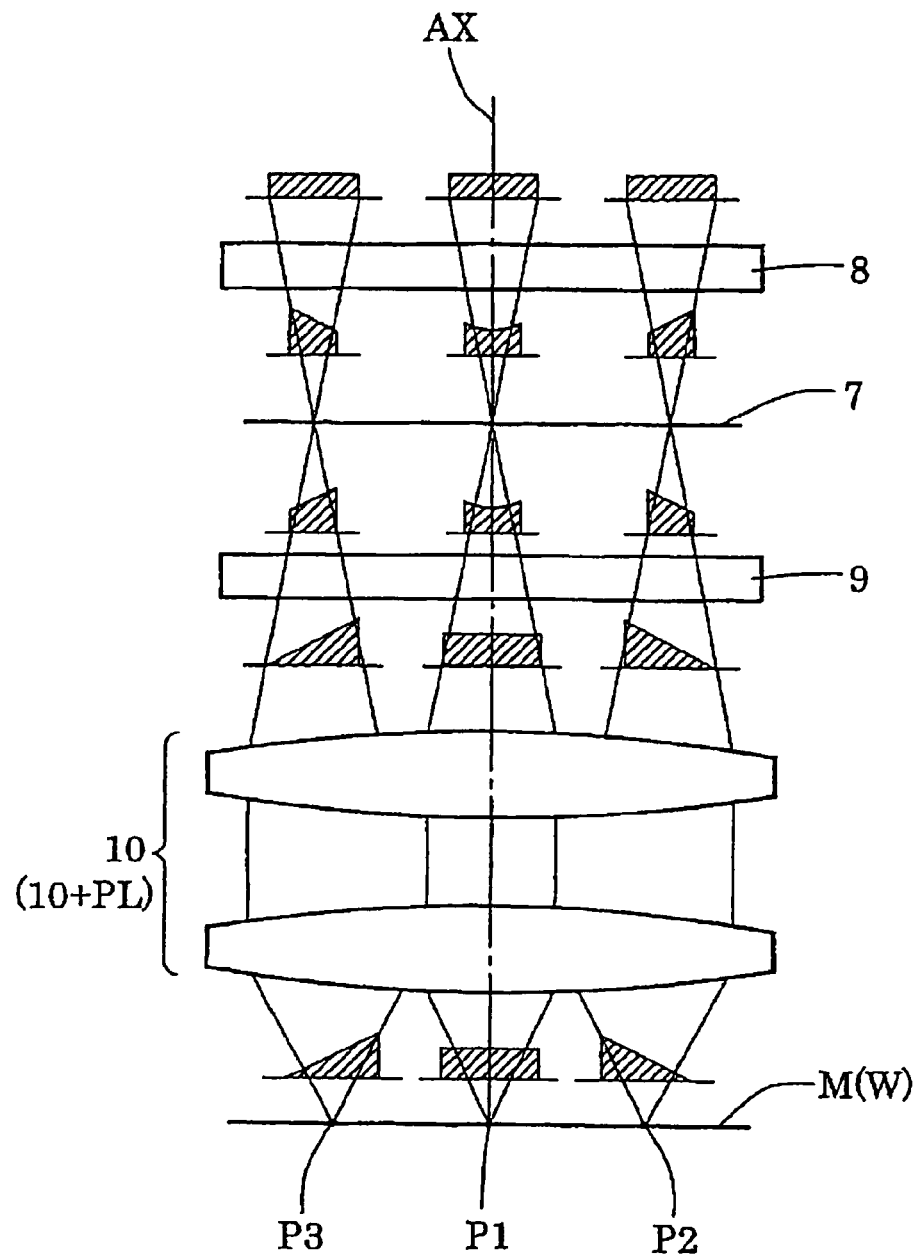
FIG. 2 is a drawing schematically showing a configuration and operation of a pair of correction filters in the embodiment.

FIG. 2 is a drawing schematically showing a configuration and operation of a pair of correction filters in the present embodiment. In the present embodiment, as shown in FIG. 2, the first correction filter 8 is located in front of the mask blind 7 (on the light source side) and the second correction filter 9 behind the mask blind 7 (on the mask side). Namely, the first correction filter 8 and the second correction filter 9 are positioned at respective positions different from each other along the optical-axis direction of the illumination optical apparatus. Each of the first correction filter 8 and the second correction filter 9 has a form of a plane-parallel plate and has a transmittance distribution of transmittances different according to incidence positions. Namely, a dense pattern of light-blocking dots of chromium, chromium oxide, or the like is formed as an adjustment film, for example, on each of an optical surface of the first correction filter 8 on the mask blind 7 side and an optical surface of the second correction filter 9 on the mask blind 7 side. Namely, the optical surface of the first correction filter 8 on the mask blind 7 side and the optical surface of the second correction filter 9 on the mask blind 7 side serve as adjustment surfaces.

Figure 3:
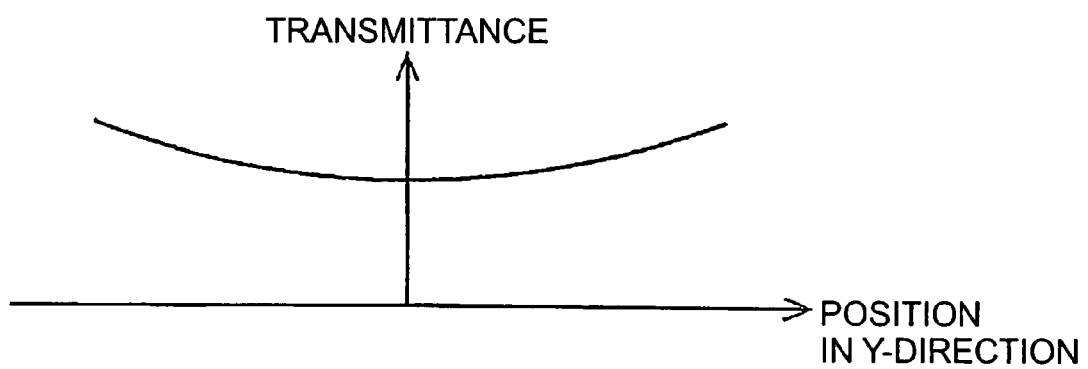
FIG. 3 is a drawing schematically showing an example of transmittance distributions given to a pair of correction filters.
Figure 3:
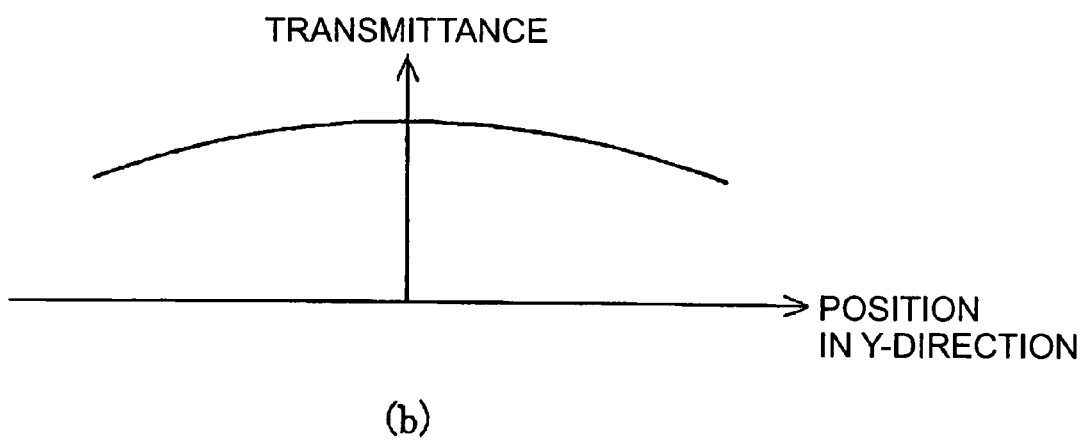

Specifically, the first correction filter 8, as shown in FIG. 3 (a), has such a transmission distribution of a quadric concave pattern that the transmittance is minimum at the center of the effective region along the Y-direction and that the transmittance monotonically increases toward the periphery in accordance with a quadratic function of distance from the center, for example. On the other hand, the second correction filter 9, as shown in FIG. 3 (*b*), has such a transmittance distribution of a quadric convex pattern that the transmittance is maximum at the center of the effective region along the Y-direction and that the transmittance monotonically decreases toward the periphery in accordance with a quadratic function of distance from the center, for example.

In the first correction filter 8a difference between the maximum transmittance in the periphery of the effective region and the minimum transmittance at the center is set, for example, to 4% and in the second correction filter 9 a difference between the minimum transmittance in the periphery of the effective region and the maximum transmittance at the center is set, for example, to 4%. Namely, the first correction filter 8 has the transmittance distribution of the quadric 4%-concave pattern and the second correction filter 9 the transmittance distribution of the quadric 4%-convex pattern. As a result, the first correction filter 8 and the second correction filter 9 come to have the transmittance distributions complementary to each other.

In the present embodiment, the apparatus is so set that a distance between the first correction filter 8 (precisely, the optical surface thereof on the mask side as an adjustment film) and the mask blind 7 is equal to a distance between the second correction filter 9 (precisely, the optical surface thereof on the light source side as an adjustment film) and the mask blind 7. Now, let us focus attention on rays arriving at a center point P1 as intersecting with the optical axis AX on the mask M as a surface to be illuminated (or the wafer W as a final surface to be illuminated), rays arriving at a point P2 a predetermined distance apart in the +Y direction from the center point P1, and rays arriving at a point P3 the same distance apart in the −Y direction from the center point P1.

It is assumed herein that in a state in which the first correction filter 8 and the second correction filter 9 are absent, a pupil luminance distribution about the center point P1, a pupil luminance distribution about the point P2, and a pupil luminance distribution about the point P3 all are uniform as indicated by hatched regions above the first correction filter 8 in FIG. 2. That a pupil luminance distribution about a certain point on a surface to be illuminated is uniform is nothing but that a light intensity distribution formed on the illumination pupil plane (e.g., the rear focal plane of the micro fly's eye lens 5) by rays arriving at that point is uniform.

When only the first correction filter 8 with the transmittance distribution of the quadric 4%-concave pattern is present, the pupil luminance distribution about the center point P1 changes from the uniform pattern into a concave pattern, the pupil luminance distribution about the point P2 changes from the uniform pattern into an inclined pattern, and the pupil luminance distribution about the point P3 changes from the uniform pattern into an inclined pattern inclined in the opposite inclination direction to the inclined pattern of the point P2, as indicated by hatched regions between the first correction filter 8 and the mask blind 7 and between the mask blind 7 and the second correction filter 9 in FIG. 2.

Namely, the adjustment film of the first correction filter 8 outputs light with a light intensity distribution different from that of incident light, and effects the following changes: a change in light intensity distribution from the uniform intensity distribution into a concave intensity distribution when a light beam to arrive at the center point P1 passes through the adjustment film of the first correction filter 8; a change in light intensity distribution from the uniform intensity distribution into an inclined intensity distribution when a light beam to arrive at the point P2 passes through the adjustment film of the first correction filter 8; a change in light intensity distribution from the uniform intensity distribution into an intensity distribution inclined in the opposite direction to the inclined intensity distribution corresponding to the point P2 when a light beam to arrive at the point P3 passes through the adjustment film of the first correction filter 8.

Furthermore, when the second correction filter 9 with the transmittance distribution of the quadric 4%-convex pattern is also present in addition to the first correction filter 8, the second correction filter 9 acts to return the pupil luminance distribution of the concave pattern about the center point P1 to a uniform pattern and to change the inclined patterns of the pupil luminance distributions about the point P2 and the point P3 to inclined patterns with enhanced degree of inclination, as indicated by hatched regions between the second correction filter 9 and the imaging optical system 10 (or imaging optical system 10+projection optical system PL) and between the imaging optical system 10 (or imaging optical system 10+projection optical system PL) and the mask M (or the wafer W) in FIG. 2.

Namely, the adjustment film of the second correction filter 9 also outputs light with a light intensity distribution different from that of incident light, and effects the following changes: a change from the light intensity distribution of the concave intensity distribution into a uniform intensity distribution when a light beam to arrive at the center point P1 passes through the adjustment film of the second correction filter 9; a change from the light intensity distribution of the inclined intensity distribution into a further inclined intensity distribution when a light beam to arrive at the point P2 passes through the adjustment film of the second correction filter 9; a change from the light intensity distribution of the inclined intensity distribution into a further inclined intensity distribution when a light beam to arrive at the point P3 passes through the adjustment film of the second correction filter 9.

In other words, the cooperation of the first correction filter 8 and the second correction filter 9 changes the uniform pupil luminance distribution about the point P2 (and points having the same Y-coordinate as P2) to the linear inclination pattern and changes the uniform pupil luminance distribution about the point P3 (and points having the same Y-coordinate as P3) to the linear inclination pattern having the inclination direction opposite to that of the inclination pattern about the point P2 and the same degree of inclination, without change in the uniform pupil luminance distribution about the center point P1 (and points having the same Y-coordinate as P1). The degree of adjustment of linear inclination of the pupil luminance distributions about the point P2 and the point P3 is dependent upon the distance of the point P2 and the point P3 along the Y-direction from the center point P1.

Namely, the degree of linear inclination adjustment for a pupil luminance distribution about a certain point increases with distance from the center point P1 along the Y-direction. It is also apparent with reference to FIG. 2 that a size of a region where rays to arrive at each point on the surface to be illuminated pass through each of the first correction filter 8 and the second correction filter 9 (which will be referred to hereinafter as "partial region") becomes larger as the first correction filter 8 and the second correction filter 9 are set more distant from the mask blind 7, and that the degree of linear inclination adjustment for a pupil luminance distribution about each point also increases therewith. It is a matter of course that the degree of linear inclination adjustment for a pupil luminance distribution about each point also increases as the degree of change in the transmittance distributions of the first correction filter 8 and the second correction filter 9 (4% in the foregoing example) is set larger.

Since the present embodiment has the configuration wherein the first correction filter 8 and the second correction filter 9 have the complementary transmittance distributions and wherein the first correction filter 8 and the second correction filter 9 are set equidistant from the mask blind 7 on both sides thereof, as described above, the position and size of the partial region about each point on the surface to be illuminated, in the first correction filter 8 are almost equal to those in the second correction filter 9. As a result, the pupil luminance distribution about each point on the surface to be illuminated is adjusted on a point-by-point basis by cooperation of the first correction filter 8 and the second correction filter 9, but the illuminance distribution on the surface to be illuminated is maintained almost uniform without substantial change.

In the present embodiment, as described above, where a first light beam is defined as a light beam to arrive at a first point (e.g., the point P1) on the surface to be illuminated and where a second light beam is defined as a light beam to arrive at a second point (e.g., the point P2 or P3) different from the first point on the surface to be illuminated, a change state of light intensity distribution imposed by the first correction filter 8 and the second correction filter 9, for the first light beam passing through the first correction filter 8 and the second correction filter 9 is different from a change state of light intensity distribution imposed by the first correction filter 8 and the second correction filter 9, for the second light beam passing through the first correction filter 8 and the second correction filter 9. This makes it feasible to independently adjust each of pupil luminance distributions about respective points (e.g., the first point and the second point) on the surface to be illuminated (M, W).

Namely, in the present embodiment the first correction filter 8 and the second correction filter 9 constitute an adjuster for independently adjusting each of pupil luminance distributions about respective points on the surface to be illuminated (M, W). As a result, the exposure apparatus of the present embodiment is able to adjust each of pupil luminance distributions at respective points on the surface to be illuminated to being almost uniform, while maintaining the illuminance distribution almost uniform on the surface to be illuminated (M, W); therefore, it is able to accurately transfer the microscopic pattern of the mask M in a desired line width across the entire exposure region onto the wafer W.

In the above description, the first correction filter 8 and the second correction filter 9 are set equidistant from the mask blind 7 on both sides thereof; however, the same effect as in the foregoing embodiment is also achieved when they are set equidistant on both sides of a conjugate plane optically conjugate with the wafer W as a final surface to be illuminated, specifically, when they are set equidistant on both sides of the mask M, for example. In the above description, the first correction filter 8 has the transmittance distribution of the quadric concave pattern and the second correction filter 9 has the transmittance distribution of the quadric convex pattern; however, the same effect as in the foregoing embodiment is also achieved in a case where the first correction filter 8 has a transmittance distribution of a quadric convex pattern and where the second correction filter 9 has a transmittance distribution of a quadric concave pattern.

In the above description, the first correction filter 8 and the second correction filter 9 have the transmittance distributions of the quadric patterns; however, without having to be limited to this, a variety of modification examples can be contemplated as to the patterns of the transmittance distributions given to the first correction filter 8 and the second correction filter 9. Specifically, for example, it is also possible to contemplate a modification example wherein the first correction filter 8 has, for example, such a transmittance distribution of a quartic M-shaped pattern that the transmittance increases once and then decreases from the center toward the periphery in accordance with a quartic function of distance from the center of the effective region along the Y-direction, as shown in FIG. 4 (*a*).

Figure 4:
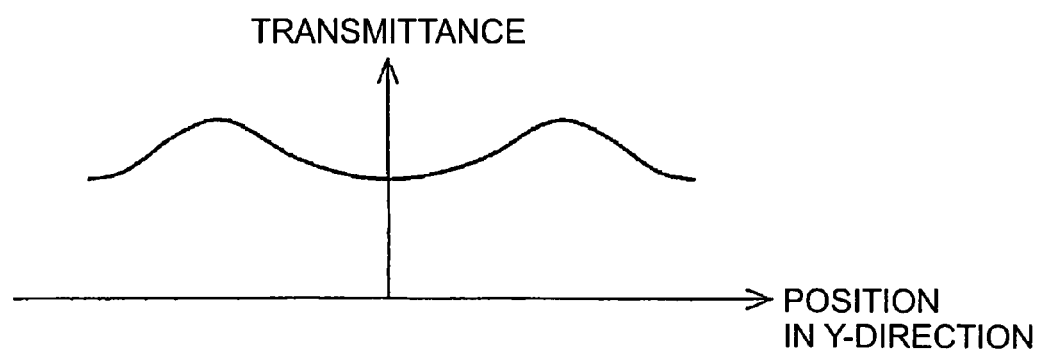
FIG. 4 is a drawing schematically showing another example of transmittance distributions given to a pair of correction filters.
Figure 4:
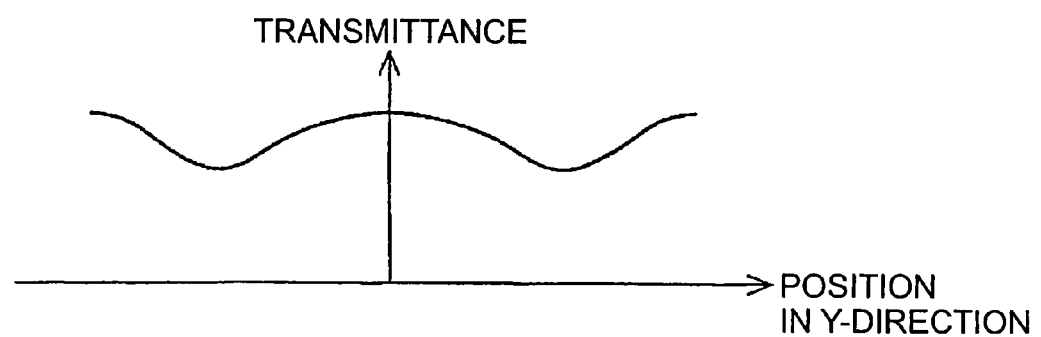

In this modification example, the second correction filter 9 has such a transmittance distribution of a quartic W-shaped pattern that the transmittance decreases once and then increases from the center toward the periphery in accordance with a quartic function of distance along the Y-direction from the center of the effective region, as shown in FIG. 4 (*b*). In this case, the transmittance distribution of the first correction filter 8 is set to be complementary to the transmittance distribution of the second correction filter 9, with the same effect as in the foregoing embodiment. However, since the first correction filter 8 and the second correction filter 9 have the transmittance distributions of the quartic patterns, the inclination adjustment effect achieved is not the linear inclination adjustment, but cubical inclination adjustment. It is noted that the first correction filter 8 and the second correction filter 9 may have their respective transmittance distributions whose patterns are higher than the quartic. The patterns of the transmittance distributions of the patterns of the first correction filter 8 and the second correction filter 9 may contain an inclination component (linear component). For example, they may be transmittance distributions each of which is a combination of an inclination component with a quadratic component (or a quartic or higher component). The patterns of the transmittance distributions of the first correction filter 8 and the second correction filter 9 may also be odd-order components such as cubic components.

In the above description, the first correction filter 8 and the second correction filter 9 are provided with the respective one-dimensional transmittance distributions along the Y-direction, but it is also possible to contemplate a variety of modification examples as to change directions of the one-dimensional transmittance distributions. It is also possible to provide the first correction filter 8 and the second correction filter 9 with respective two-dimensional transmittance distributions, e.g., rotationally symmetric transmittance distributions. The transmittance distributions to be given to the first correction filter 8 and to the second correction filter 9 can also be defined according to other appropriate functions. An example is, for example, to define the transmittance distributions of the first correction filter 8 and the second correction filter 9 by later-described Zernike polynomials, whereby each of the pupil luminance distributions about respective points on the surface to be illuminated can be adjusted on a point-by-point basis in accordance with a variety of forms.

Incidentally, in the foregoing embodiment, where the first correction filter 8 and the second correction filter 9 are provided with the transmittance distributions through the use of the dense patterns of light-blocking dots like chromium dots, it is necessary to evaluate transfer of each dot onto the wafer W and influence of diffraction at each dot and to set the size of each dot, the distances of the first correction filter 8 and the second correction filter 9 from the mask blind 7, and so on. In the above description, the first correction filter 8 and the second correction filter 9 are provided with the transmittance distributions through the use of the dense patterns of light-blocking dots but, without having to be limited to it, it is also possible to provide the filters with continuously changing transmittance distributions by controlling thicknesses of thin films as the adjustment films. In another configuration, the transmittance distributions of optically transparent members themselves forming the first correction filter 8 and the second correction filter 9 may be set to given transmittance distributions. The transmittance distributions given to the first correction filter 8 and to the second correction filter 9 are not limited to the continuously changing transmittance distributions, but may be stepwise changing transmittance distributions.

In the foregoing embodiment, the transmittance distribution of the first correction filter 8 is set to be complementary to the transmittance distribution of the second correction filter 9; however, without having to be limited to this, it is also possible to contemplate a modification example wherein the second correction filter 9 is provided with a transmittance distribution substantially different from a transmittance distribution complementary to the transmittance distribution of the first correction filter 8. In this modification example, the illuminance distribution on the surface to be illuminated is adjusted according to the difference between the transmittance distribution of the second correction filter 9 and the transmittance distribution complementary to the transmittance distribution of the first correction filter 8, whereby it is feasible to adjust each of the pupil luminance distributions at respective points on the surface to be illuminated to being almost uniform, while adjusting the illuminance distribution on the surface to be illuminated to being almost uniform.

Similarly, as a modification example of actively adjusting the illuminance distribution on the surface to be illuminated, the first correction filter 8 and the second correction filter 9 can also be set at mutually different distances on both sides of the mask blind 7. In this case, the illuminance distribution on the surface to be illuminated can be adjusted according to the difference between the distance of the first correction filter 8 from the mask blind 7 and the distance of the second correction filter 9 from the mask blind 7, whereby it is eventually feasible to adjust each of the pupil luminance distributions at respective points on the surface to be illuminated to being almost uniform, while adjusting the illuminance distribution on the surface to be illuminated to being almost uniform.

Figure 5:
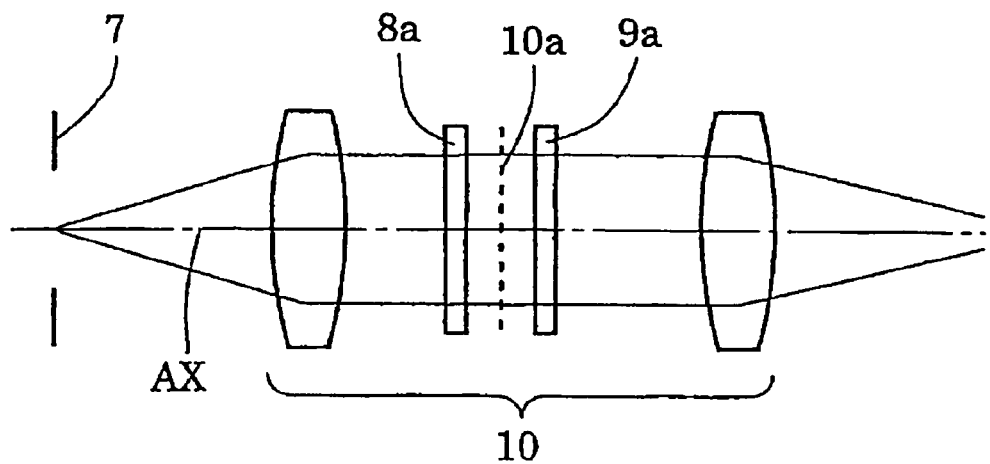
FIG. 5 is a drawing schematically showing a modification example using a pair of correction filters with transmittance distributions of transmittances different according to incidence angles.
Figure 5:
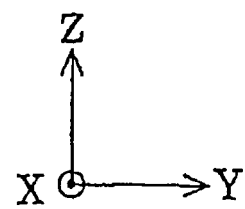

In the foregoing embodiment, the first correction filter 8 and the second correction filter 9 have their respective transmittance distributions of transmittances different according to incidence positions, but, without having to be limited to it, it is also possible to contemplate a modification example wherein the pair of correction filters are provided with their respective transmittance distributions of transmittances different according to incidence angles. In this modification example, for example as shown in FIG. 5, one correction filter 8*a* is located on the light source side with respect to the pupil plane 10*a* of the imaging optical system 10 (which is a conjugate plane optically conjugate with the illumination pupil plane), and the other correction filter 9*a* is located on the mask side with respect to the pupil plane 10*a* of the imaging optical system 10.

In this case, where a first light beam is defined as a light beam to arrive at a first point on the surface to be illuminated and where a second light beam is defined as a light beam to arrive at a second point different from the first point on the surface to be illuminated, an angle of incidence upon passage of the first light beam through the correction filters 8*a* and 9*a* is different from that upon passage of the second light beam through the correction filters 8*a* and 9*a*; therefore, a change state of light intensity distribution given to the first light beam by the correction filters 8*a* and 9*a* is different from a change state of light intensity distribution given to the second light beam by the correction filters 8*a* and 9*a*.

In this case, therefore, the same effect is also achieved as in the foregoing embodiment and the foregoing modification examples. Namely, by adopting a configuration wherein the transmittance distributions of the pair of correction filters 8*a* and 9*a* are set to be complementary to each other and wherein the pair of correction filters 8*a* and 9*a* are set equidistant on both sides of the pupil plane 10*a* of the imaging optical system 10, it is feasible to adjust each of the pupil luminance distributions at respective points on the surface to be illuminated to being almost uniform, while maintaining the illuminance distribution almost uniform on the surface to be illuminated.

When the transmittance distributions of the pair of correction filters 8*a* and 9*a* are set in a substantially uncomplementary relation, or when the pair of correction filters 8*a* and 9*a* are set at mutually different distances on both sides of the pupil plane 10*a* of the imaging optical system 10, it is feasible to adjust each of the pupil luminance distributions at respective points on the surface to be illuminated to being almost uniform, while adjusting the illuminance distribution on the surface to be illuminated to being almost uniform. It is also possible to use a correction filter with a transmittance distribution of transmittances different according to incidence positions, in combination with a correction filter with a transmittance distribution of transmittances different according to incidence angles, or to use a correction filter pair (8, 9) with respective transmittance distributions of transmittances different according to incidence positions, in combination with a correction filter pair (8*a*, 9*a*) with respective transmittance distributions of transmittances different according to incidence angles.

In the above description, the pair of correction filters (8, 9; 8*a*, 9*a*) are provided with their respective transmittance distributions, but, without having to be limited to this, the same effect is also achieved as in the foregoing embodiment and the foregoing modification examples, by using a first adjustment film and a second adjustment film with their respective reflectance distributions of reflectances different according to incidence positions, or by using a first adjustment film and a second adjustment film with their respective reflectance distributions of reflectances different according to incidence angles. It is also possible to use an adjustment film (correction filter) with a transmittance distribution of transmittances different according to incidence positions or incidence angles, in combination with an adjustment film with a reflectance distribution of reflectances different according to incidence positions or incidence angles.

In the above description, the pair of correction filters (8, 9; 8*a*, 9*a*) are used, i.e., the pair of adjustment films (adjustment surfaces) in other words are used, to adjust each of pupil luminance distributions at respective points on the surface to be illuminated to being almost uniform, while maintaining or adjusting the illuminance distribution on the surface to be illuminated to being almost uniform. However, without having to be limited to this, the effect of the present invention can also be generally achieved by means of an adjuster comprising a plurality of adjustment films (adjustment surfaces) having predetermined transmittance distributions or reflectance distributions. Namely, it is possible to contemplate a variety of modification examples as to the number and arrangement of the adjustment films (adjustment surfaces) which the adjuster comprises.

Figure 6:
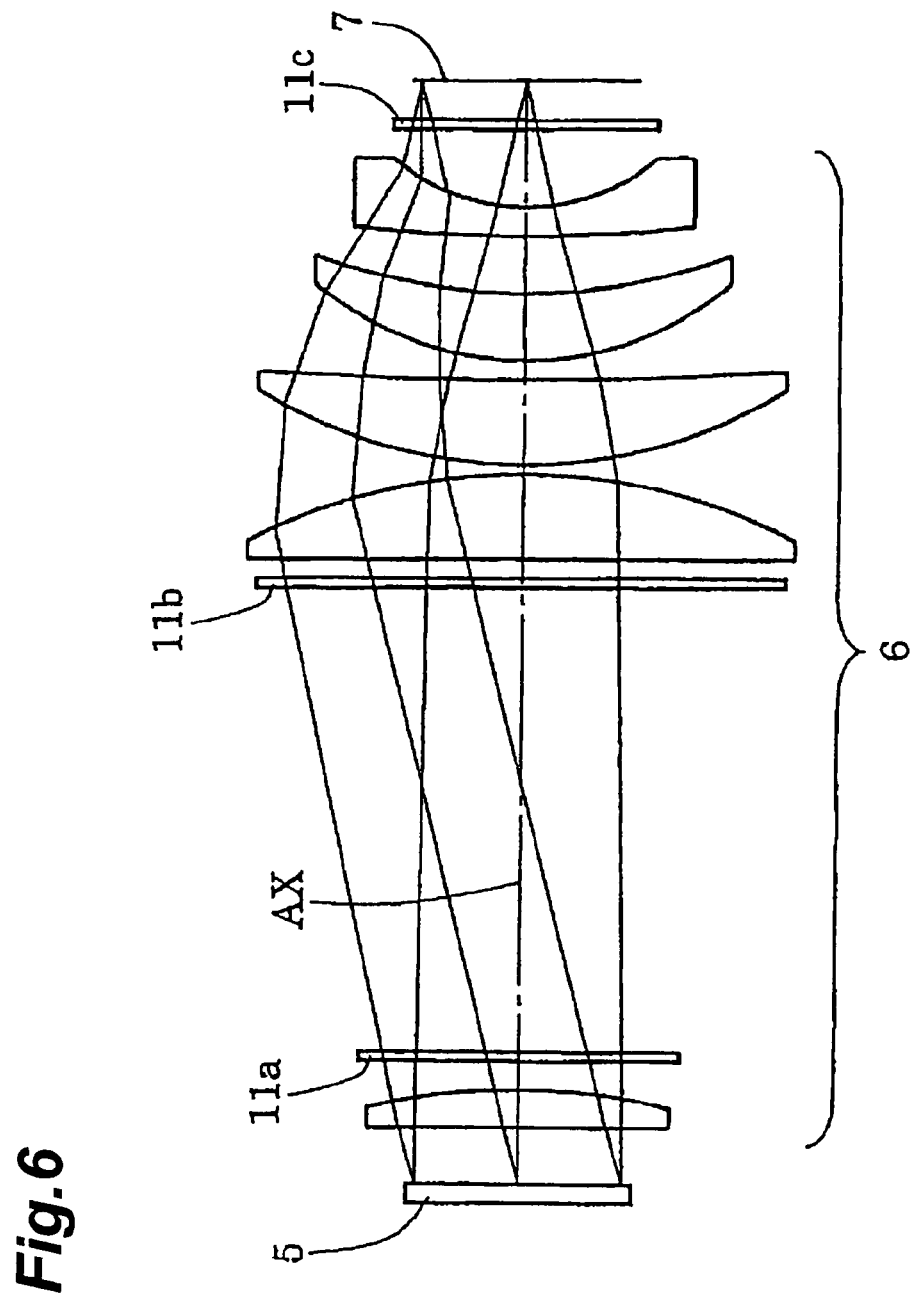
FIG. 6 is a drawing schematically showing a modification example using three correction filters with transmittance distributions of transmittances different according to incidence positions.

Specifically, for example as shown in FIG. 6, it is also possible to contemplate a modification example using three correction filters 11*a*-11*c* having their respective transmittance distributions of transmittances different according to incidence positions. In the modification example of FIG. 6, the first correction filter 11a and the second correction filter 11b are located in order from the light source side in the optical path of the condenser optical system 6 between the micro fly's eye lens 5 and the mask blind 7, and the third correction filter 11c is located in the optical path between the condenser optical system 6 and the mask blind 7.

Figure 7:
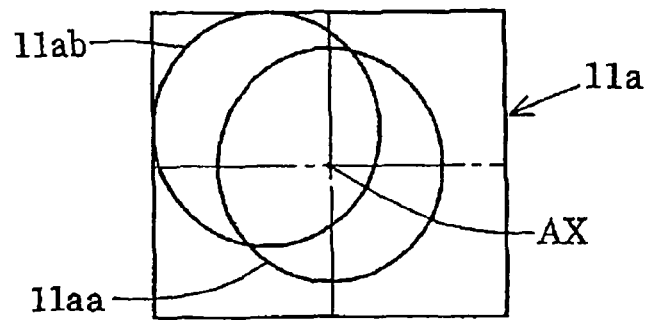
FIG. 7 is a drawing showing cross sections of an on-axis light beam and an off-axis light beam passing through each of the correction filters in the modification example of FIG. 6.
Figure 7:
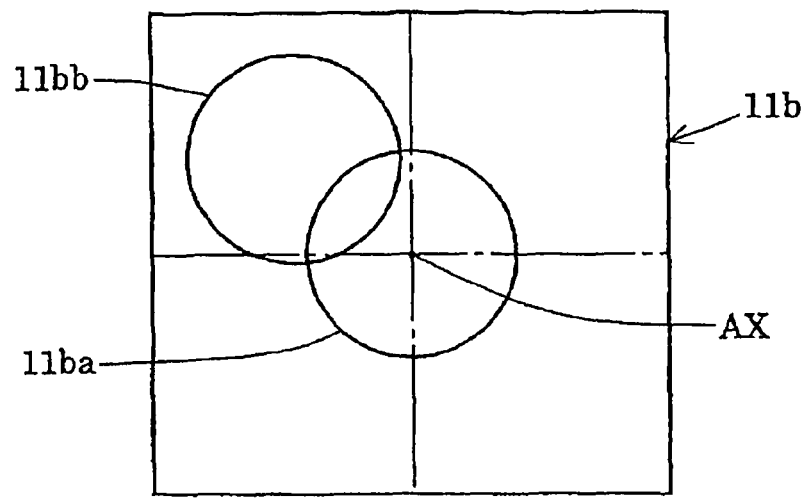
Figure 7:
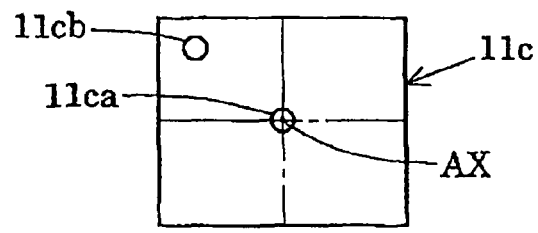

In this case, since the correction filters 11a-11c are located at mutually different positions in the optical-axis direction of the illumination optical apparatus, as shown in FIG. 7, regions where an on-axis light beam (a light beam arriving at an intersection between the mask blind 7 and the optical axis AX) passes through the respective correction filters 11a-11c, i.e., on-axis partial regions 11aa, 11ba, 11ca are different among the correction filters 11a-11c. Similarly, regions where an off-axis light beam (a light beam arriving at a point on the mask blind 7 distant from the optical axis AX) passes through the respective correction filters 11a-11c, i.e., off-axis partial regions 11ab, 11bb, 11cb are also different among the correction filters 11a-11c.

In this modification example, it is feasible to adjust each of pupil luminance distributions at respective points on the surface to be illuminated to being almost uniform, while adjusting the illuminance distribution on the surface to be illuminated to being almost uniform, by properly setting the transmittance distributions of the respective correction filters 11a-11c, the positions and sizes of the on-axis partial regions and the off-axis partial regions on the respective correction filters 11a-11c, and so on. Furthermore, the effect of the present invention can be generally achieved by properly setting the transmittance distributions (or reflectance distributions) of the respective adjustment surfaces (adjustment films), the positions and sizes of the on-axis partial regions and the off-axis partial regions on the respective adjustment surfaces (adjustment films), and so on, using an adjuster comprising a plurality of adjustment surfaces (adjustment films) having predetermined transmittance distributions (or reflectance distributions) of transmittances (or reflectances) varying according to incidence positions or incidence angles.

In this modification example all the correction filters 11a-11c are located in the optical path between the micro fly's eye lens 5 as an optical integrator and the mask blind 7, but these correction filters 11a-11c may be located in the optical path between the mask blind 7 and the surface to be illuminated, or only one or two of the correction filters (e.g., only the correction filter 11c) may be located in the optical path between the mask blind 7 and the surface to be illuminated.

In each of the foregoing embodiment and modification examples, if there is a change in the illuminance distribution on the surface to be illuminated, the change in the illuminance distribution on the surface to be illuminated may be compensated for, for example, by additionally using a variable slit apparatus as described in International Publication 2005/048326, or an illuminance distribution controlling apparatus as described in U.S. Pat. No. 6,771,350 or the like.

In the above description, the adjustment surface (adjustment film) with the predetermined transmittance distribution (or reflectance distribution) is formed on the optical surface of each correction filter having the form of the plane-parallel plate, but, without having to be limited to this, it is also possible to form each adjustment surface (adjustment film) on a surface of a lens or a reflecting mirror, i.e., on a convex lens surface, a concave lens surface, a convex reflecting surface, or a concave reflecting surface. It is, however, a matter of course that it is generally easier to manufacture each adjustment surface (adjustment film) on an optical surface of an optical member having a planar optical surface.

Now, let the configuration from the light source 1 to the projection optical system PL be an illumination optical apparatus for illuminating the wafer W as a surface to be illuminated, and let us describe an adjustment method for adjusting this illumination optical apparatus (1-PL). In the present embodiment, for simplicity of description of the adjustment method, it is assumed that a plurality of (two or more) correction filters having respective predetermined transmittance distributions are used to adjust each of pupil luminance distributions at respective points on the surface to be illuminated to being almost uniform, while adjusting the illuminance distribution on the surface to be illuminated (the surface where the wafer W is set) to being almost uniform.

Figure 8:
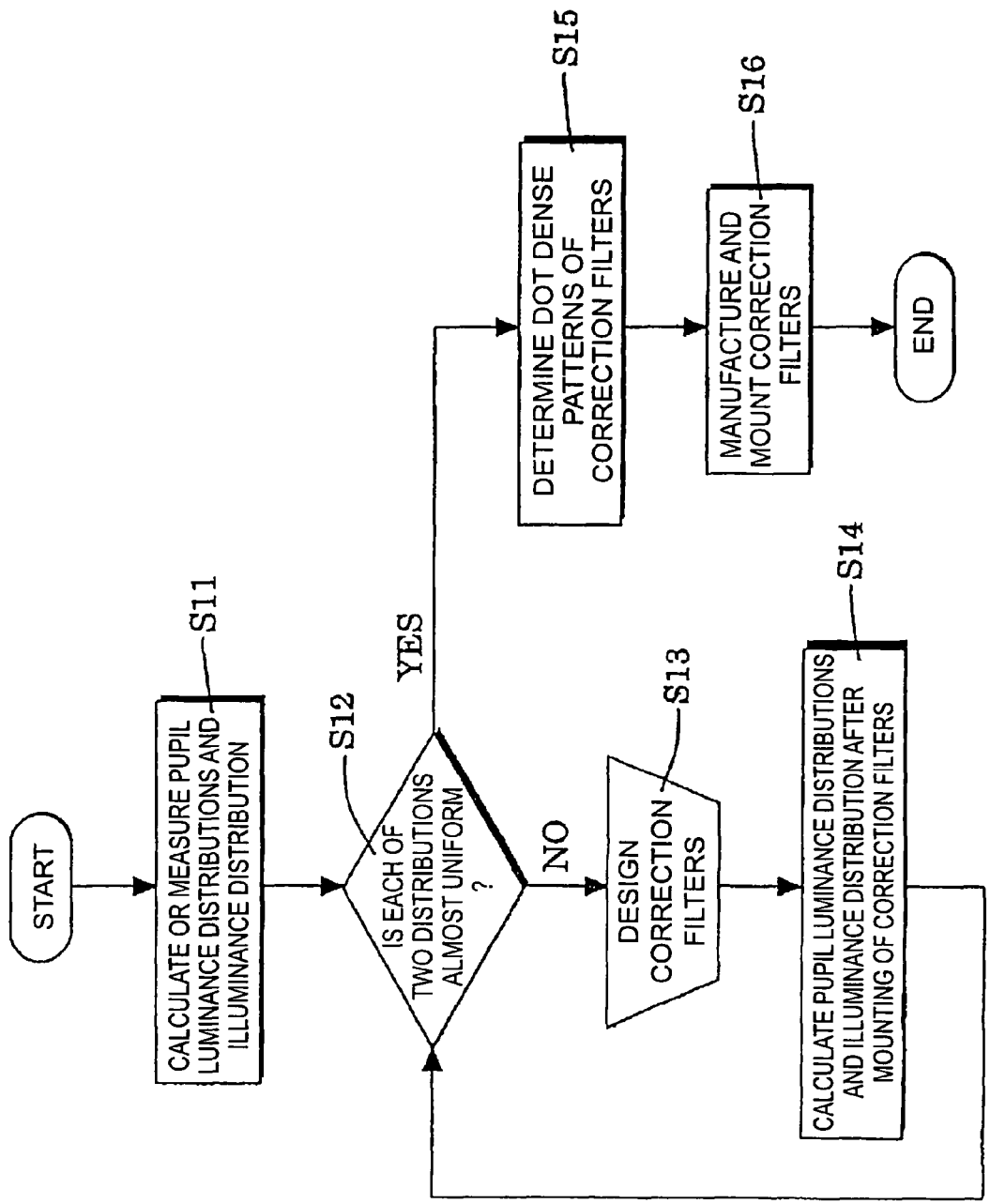
FIG. 8 is a flowchart schematically showing steps in an adjustment method of illumination optical apparatus according to the embodiment of the present invention.

FIG. 8 is a flowchart schematically showing steps in an adjustment method of illumination optical apparatus according to the present embodiment. In the adjustment method of illumination optical apparatus (1-PL) according to the present embodiment, as shown in FIG. 8, the first step is to acquire pupil luminance distributions about a plurality of points on the surface to be illuminated, and an illuminance distribution on the surface to be illuminated (S11). Specifically, the distribution acquisition step S11 is to calculate the pupil luminance distributions about a plurality of points on the surface to be illuminated, and the illuminance distribution on the surface to be illuminated, based on design data of the illumination optical apparatus (1-PL).

The design data of the illumination optical apparatus (1-PL) used herein includes, for example, data of the optical system (6-PL) from just after the micro fly's eye lens 5 to just before the wafer W, i.e., data such as curvature radii of respective optical surfaces, axial separations of respective optical surfaces, refractive indices and types of optical materials forming the respective optical members, the wavelength of used light, transmittances of the respective optical members, and incidence angle characteristics of antireflection films and reflecting films. Reference is made, for example, to International Publication WO02/031570 as to how to calculate the pupil luminance distributions about a plurality of points on the surface to be illuminated, based on the design data. In addition, how to calculate the illuminance distribution on the surface to be illuminated, based on the design data is well known, and reference is made, for example, to Japanese Patent Application Laid-Open No. 3-216658.

Figure 9:
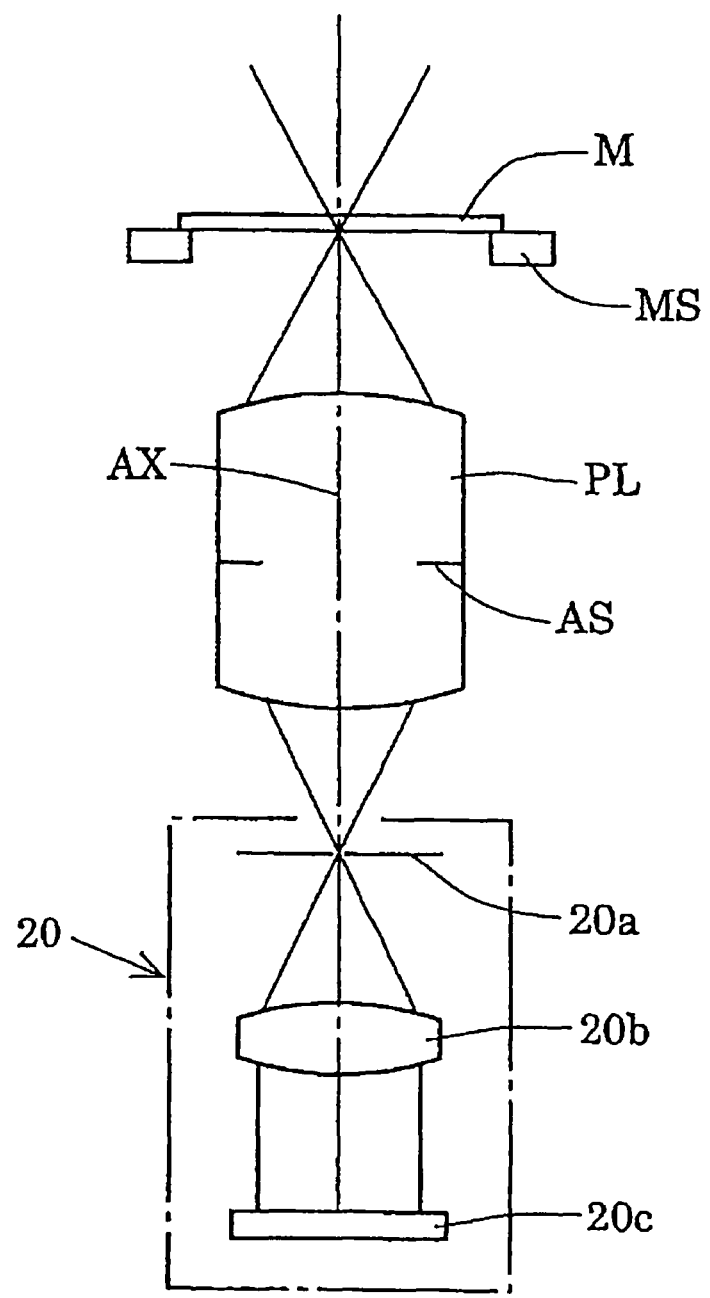
FIG. 9 is a drawing schematically showing a configuration of an apparatus for measuring pupil luminance distributions about plural points on a surface to be illuminated.

Alternatively, the distribution acquisition step S11 may be to measure the pupil luminance distributions about a plurality of points on the surface to be illuminated and the illuminance distribution on the surface to be illuminated, for each of apparatus fabricated actually. Specifically, the pupil luminance distributions about a plurality of points on the surface to be illuminated can be measured, for example, with a distribution measuring device 20 shown in FIG. 9. The measurement of the pupil luminance distributions with the distribution measuring device 20 is carried out in a state in which the wafer W is retracted from the optical path. The distribution measuring device 20 has a pinhole member 20a, a condenser lens 20b, and a photodetector 20c, for example, like a two-dimensional CCD.

The pinhole member 20a is located at the position of the imaging plane of the projection optical system PL (i.e., a height where an exposed surface of the wafer W is to be positioned during exposure). The pinhole member 20a is located at the front focal position of the condenser lens 20b, and the photodetector 20c is located at the rear focal position of the condenser lens 20b. Therefore, a detecting surface of the photodetector 20c is located at a position optically conjugate with the position of aperture stop AS of the projection optical system PL. In the distribution measuring device 20, light having passed through the projection optical system PL travels through a pinhole of the pinhole member 20a, is then subject to focusing operation of the condenser lens 20b, and thereafter reaches the detecting surface of the photodetector 20c.

In this way, a light intensity distribution corresponding to that at the position of the aperture stop AS is formed on the detecting surface of the photodetector 20c. Namely, the distribution measuring device 20 measures the light intensity distribution formed at the position of the aperture stop AS (a position optically conjugate with the rear focal plane of the micro fly's eye lens 5) by a light beam arriving at the pinhole of the pinhole member 20a, i.e., a pupil luminance distribution about the pinhole point on the surface to be illuminated. Consequently, the pupil luminance distributions about a plurality of desired points on the surface to be illuminated can be measured by repeatedly carrying out the measurement while two-dimensionally moving the position of the pinhole of the pinhole member 20a through two-dimensional movement of the wafer stage WS along the plane perpendicular to the optical axis AX of the projection optical system PL.

Figure 10:
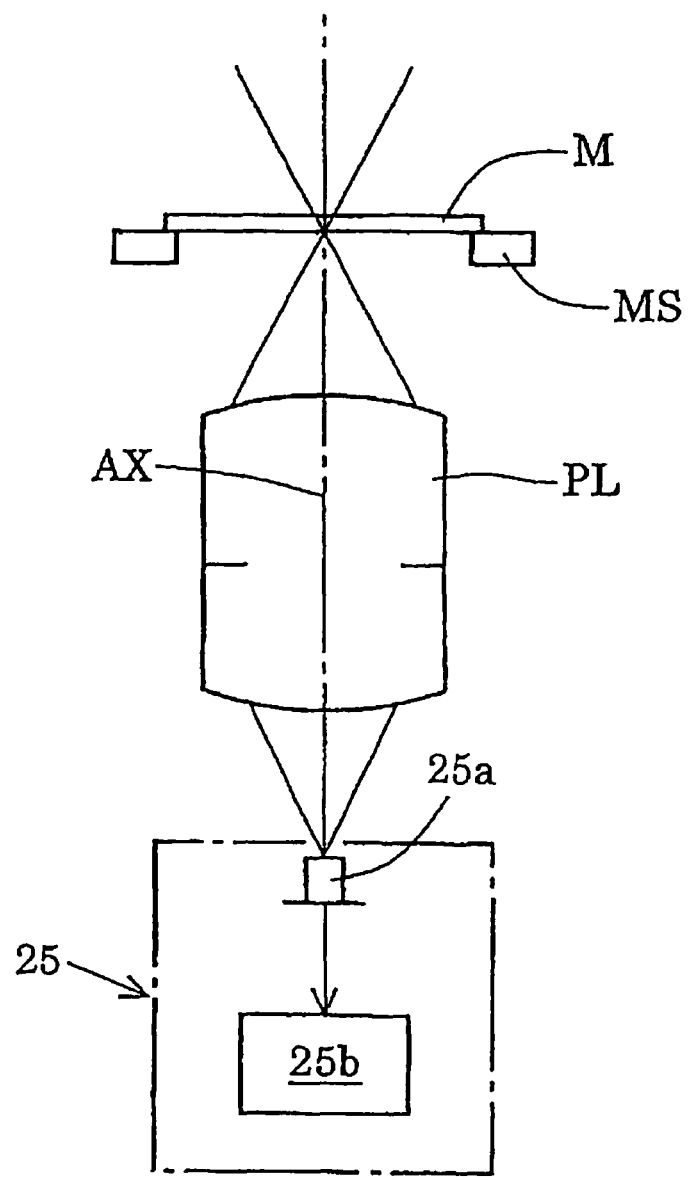
FIG. 10 is a drawing schematically showing a configuration of an apparatus for measuring an illuminance distribution on a surface to be illuminated.

The illuminance distribution on the surface to be illuminated can be measured, for example, with an illuminance measuring device 25 shown in FIG. 10. The measurement of the illuminance distribution with the illuminance measuring device 25 is also carried out in a state in which the wafer W is retracted from the optical path. The illuminance measuring device 25 is provided, for example, with a photodiode 25a as a photodetector for measuring the illuminance distribution on the imaging plane of the projection optical system PL (i.e., the surface to be illuminated). The output of photodiode 25a is connected to a signal processor 25b.

The illuminance measuring device 25 is arranged to successively measure illuminance distribution data at each of positions on the imaging plane of the projection optical system PL via the photodiode 25a through two-dimensional movement of the wafer stage WS along the plane perpendicular to the optical axis AX of the projection optical system PL. It is also possible to adopt a configuration wherein a plurality of photodiodes 25a are two-dimensionally arranged and wherein the illuminance distribution data on the imaging plane of the projection optical system PL is measured all at once, without movement of the wafer stage WS. It is also possible to adopt another configuration wherein a plurality of photodiodes 25a are linearly arranged and wherein the wafer stage WS is one-dimensionally moved to effect scanning measurement of the illuminance distribution data on the imaging plane of the projection optical system PL.

In the adjustment method of the present embodiment, the next step is to determine whether each of the pupil luminance distributions about the plural points on the surface to be illuminated and the illuminance distribution on the surface to be illuminated, which were obtained by the calculation based on the design data or by the measurement using the devices 20 and 25, is almost uniform to a desired extent (S12). When it is determined in the determination step S12 that at least one of the pupil luminance distributions and the illuminance distribution is not so uniform to the desired extent (in the case of NO in the drawing), the flow proceeds to a step S13 of designing correction filters. On the other hand, when it is determined in the determination step S12 that both of the pupil luminance distributions and the illuminance distribution are almost uniform to the desired extent (in the case of YES in the drawing), the flow proceeds to a step S15 of determining dot dense patterns of the correction filters.

The design step S13 is to determine (or calculate) the required transmittance distributions to be given to the respective adjustment films, in order to independently adjust each of the pupil luminance distributions about the plural points on the surface to be illuminated and adjust the illuminance distribution on the surface to be illuminated, if necessary, so that both of the pupil luminance distributions and the illuminance distribution can be almost uniform to the desired extent. Specifically, the number and positions of the correction filters to be used are prefigured with reference to the information about the pupil luminance distributions and the illuminance distribution calculated or measured, and the transmittance distributions to be given to the respective correction filters are determined for adjusting each of the pupil luminance distributions at respective points on the surface to be illuminated to being almost uniform, while maintaining or adjusting the illuminance distribution on the surface to be illuminated to being almost uniform.

The next step is to calculate the pupil luminance distributions about plural points on the surface to be illuminated and the illuminance distribution on the surface to be illuminated, in a state in which the plurality of correction filters with the transmittance distributions determined in the design step S13 are located at their respective prefigured positions, i.e., in a mounted state of the correction filters (S14). Specifically, the distribution calculation step S14 is to calculate the pupil luminance distributions and the illuminance distribution with reference to the information about the transmittance distributions and positions of the respective correction filters in addition to the aforementioned design data information.

The next step is to determine whether each of the pupil luminance distributions about plural points on the surface to be illuminated and the illuminance distribution on the surface to be illuminated, which were calculated in the distribution calculation step S14, is almost uniform to the desired extent (S12). When it is determined in the determination step S12 that at least one of the pupil luminance distributions and the illuminance distribution is not so uniform to the desired extent (in the case of NO in the drawing), the flow proceeds again to the step S13 of designing correction filters. On the other hand, when it is determined in the determination step S12 that both of the pupil luminance distributions and the illuminance distribution are almost uniform to the desired extent (in the case of YES in the drawing), the flow proceeds to the step S15 of determining the dot dense patterns of the correction filters.

For example, after repetitive trial-and-error execution of the design step S13 and the distribution calculation step S14, the flow proceeds to the pattern determination step S15 to determine the dense patterns of light-blocking dots necessary for realizing the required transmittance distributions (transmittance distributions to be given to the respective correction filters) calculated in the design step S13. The last step is to manufacture the plurality of correction filters having the dot dense patterns determined in the pattern determination step S15, and to incorporate the manufactured correction filters at the respective predetermined positions in the optical system (S16). As described above, the pattern determination step S15 and the manufacturing-mounting step S16 constitute an adjustment step of forming and placing each of the plurality of adjustment films with the required transmittance distributions. The adjustment method of the present embodiment is completed in this manner.

Figure 11:
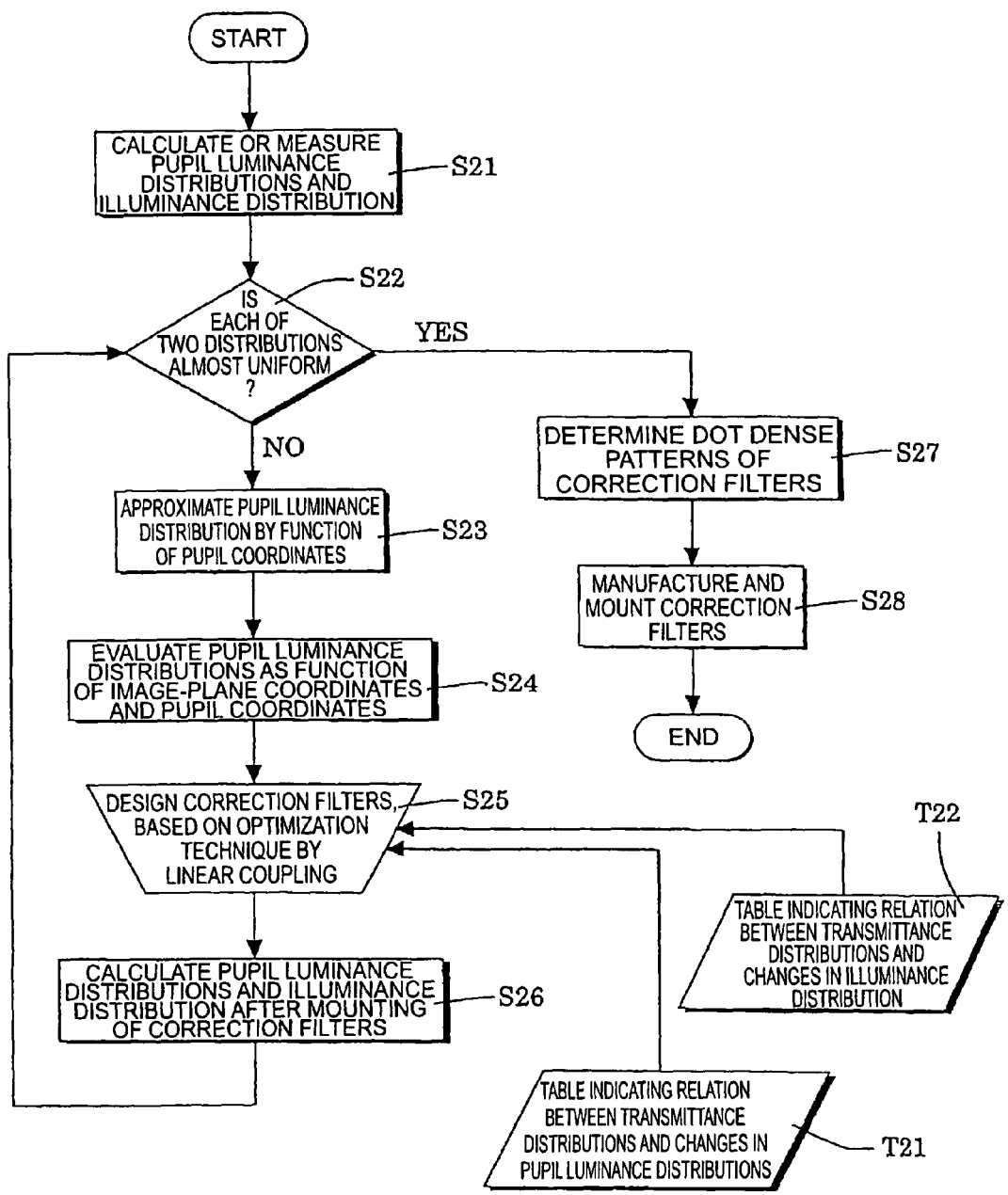
FIG. 11 is a flowchart schematically showing steps in an adjustment method according to a modification example of the embodiment of the present invention.

The next modification example of the present embodiment will illustrate an adjustment method capable of readily and accurately determining the required transmittance distributions to be given to the respective correction filters, instead of the trial-and-error method. FIG. 11 is a flowchart schematically showing steps in the adjustment method according to the modification example of the present embodiment. In the adjustment method of the modification example shown in FIG. 11, just as in the adjustment method shown in FIG. 8, the first step is to acquire the pupil luminance distributions about a plurality of points on the surface to be illuminated and the illuminance distribution on the surface to be illuminated (S21). Specifically, the distribution acquisition step S21 is to calculate the pupil luminance distributions about plural points on the surface to be illuminated and the illuminance distribution on the surface to be illuminated, based on the design data of the illumination optical apparatus (1-PL). Alternatively, the aforementioned devices 20 and 25 are used to measure the pupil luminance distributions about plural points on the surface to be illuminated and the illuminance distribution on the surface to be illuminated, for each of apparatus fabricated actually.

The next step, just as in the adjustment method shown in FIG. 8, is to determine whether each of the pupil luminance distributions about plural points on the surface to be illuminated and the illuminance distribution on the surface to be illuminated, which were obtained by the calculation based on the design data or by the measurement with the devices 20 and 25, is almost uniform to a desired extent (S22). When it is determined in the determination step S22 that at least one of the pupil luminance distributions and the illuminance distribution is not so uniform to the desired extent (in the case of NO in the drawing), the flow proceeds to an approximation step S23 of the pupil luminance distributions. On the other hand, when it is determined in the determination step S22 that both of the pupil luminance distributions and the illuminance distribution are almost uniform to the desired extent (in the case of YES in the drawing), the flow proceeds to a step S27 of determining dot dense patterns of the correction filters.

Figure 12:
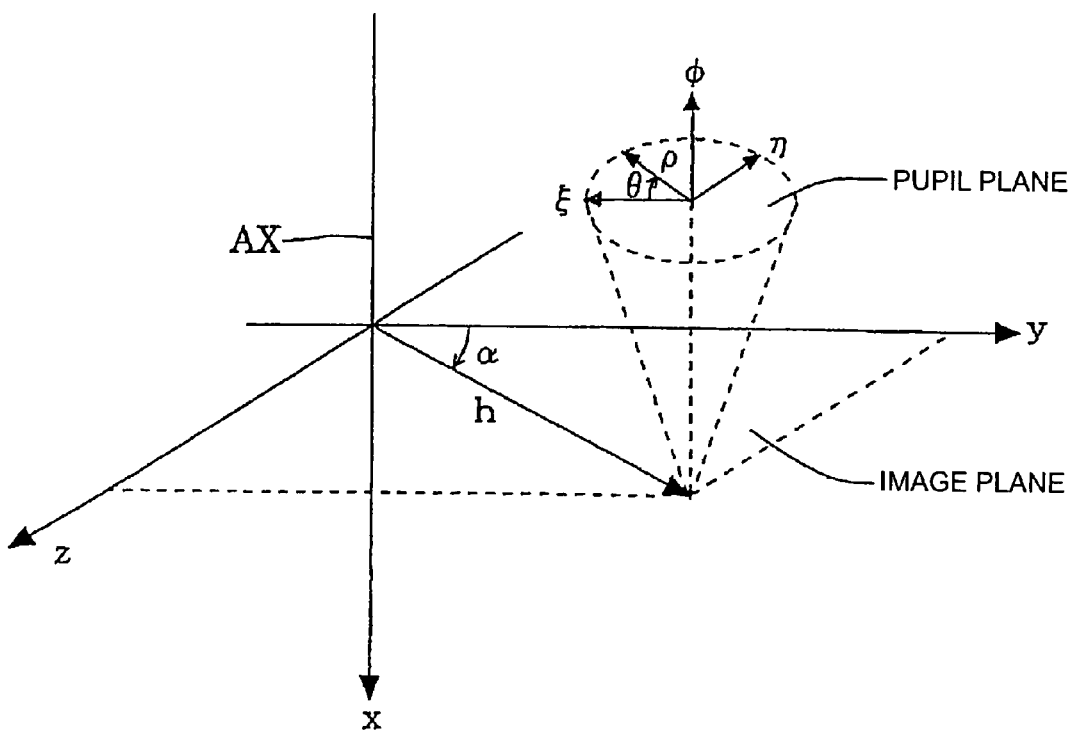
FIG. 12 is a drawing to illustrate a relation among image-plane coordinates and pupil coordinates in a projection optical system.

The approximation step S23 of the pupil luminance distributions is to approximate each of the pupil luminance distributions about respective points on the surface to be illuminated, acquired in the distribution acquisition step S21, by a predetermined polynomial as a function of pupil coordinates on the illumination pupil plane. Specifically, for example, the Zernike polynomials including the Zernike cylindrical functions $Zi(\rho,\theta)$ using the pupil polar coordinates $(\rho,\theta)$ on the illumination pupil plane as a coordinate system, are used to implement fitting (approximation) of each of the pupil luminance distributions about respective points on the image plane (the surface to be illuminated) of the projection optical system PL. The relationship among the image-plane coordinates and pupil coordinates of the projection optical system PL, i.e., the relationship among the image-plane orthogonal coordinates (y,z), the pupil orthogonal coordinates $(\xi,\eta)$, the image-plane polar coordinates $(h,\alpha)$, and the pupil polar coordinates $(\rho,\theta)$ are as schematically shown in FIG. 12. Among the coordinates, h and p are normalized radii, and $\alpha$ and $\theta$ radial angles of polar coordinates.

A pupil luminance distribution $I(\rho,\theta)$ is expanded as in Eq (1) below, using the Zernike cylindrical functions $Zi(\rho,\theta)$, for each point on the image plane of the projection optical system PL.

$$I(\rho,\theta) = \sum Ci \cdot Zi(\rho,\theta)$$
$$= C1 \cdot Z1(\rho,\theta) + C2 \cdot Z2(\rho,\theta) \ldots + Cn \cdot Zn(\rho,\theta) \quad (1)$$

In this equation, Ci represents coefficients of the respective terms of the Zernike polynomials. Table 1 below presents the functions Z1-Z36 for the first term to the thirty sixth term, out of the function system $Zi(\rho,\theta)$ in the terms of the Zernike polynomials.

TABLE 1

Z1: 1
Z2: $\rho\cos\theta$
Z3: $\rho\sin\theta$
Z4: $2\rho^2 - 1$
Z5: $\rho^2\cos2\theta$
Z6: $\rho^2\sin2\theta$
Z7: $(3\rho^2 - 2)\rho\cos\theta$
Z8: $(3\rho^2 - 2)\rho\sin\theta$
Z9: $6\rho^4 - 6\rho^2 + 1$
Z10: $\rho^3\cos3\theta$
Z11: $\rho^3\sin3\theta$
Z12: $(4\rho^2 - 3)\rho^2\cos2\theta$
Z13: $(4\rho^2 - 3)\rho^2\sin2\theta$
Z14: $(10\rho^4 - 12\rho^2 + 3)\rho\cos\theta$
Z15: $(10\rho^4 - 12\rho^2 + 3)\rho\sin\theta$
Z16: $20\rho^6 - 30\rho^4 + 12\rho^2 - 1$
Z17: $\rho^4\cos4\theta$
Z18: $\rho^4\sin4\theta$
Z19: $(5\rho^2 - 4)\rho^3\cos3\theta$
Z20: $(5\rho^2 - 4)\rho^3\sin3\theta$
Z21: $(15\rho^4 - 20\rho^2 + 6)\rho^2\cos2\theta$
Z22: $(15\rho^4 - 20\rho^2 + 6)\rho^2\sin2\theta$
Z23: $(35\rho^6 - 60\rho^4 + 30\rho^2 - 4)\rho\cos\theta$
Z24: $(35\rho^6 - 60\rho^4 + 30\rho^2 - 4)\rho\sin\theta$
Z25: $70\rho^8 - 140\rho^6 + 90\rho^4 - 20\rho^2 + 1$
Z26: $\rho^5\cos5\theta$
Z27: $\rho^5\sin5\theta$
Z28: $(6\rho^2 - 5)\rho^4\cos4\theta$
Z29: $(6\rho^2 - 5)\rho^4\sin4\theta$
Z30: $(21\rho^4 - 30\rho^2 + 10)\rho^3\cos3\theta$
Z31: $(21\rho^4 - 30\rho^2 + 10)\rho^3\sin3\theta$
Z32: $(56\rho^6 - 104\rho^4 + 60\rho^2 - 10)\rho^2\cos2\theta$
Z33: $(56\rho^6 - 104\rho^4 + 60\rho^2 - 10)\rho^2\sin2\theta$
Z34: $(126\rho^8 - 280\rho^6 + 210\rho^4 - 60\rho^2 + 5)\rho\cos\theta$
Z35: $(126\rho^8 - 280\rho^6 + 210\rho^4 - 60\rho^2 + 5)\rho\sin\theta$
Z36: $252\rho^{10} - 630\rho^8 + 560\rho^6 - 210\rho^4 + 30\rho^2 - 1$ Therefore, the approximation step S23 is to perform the fitting by the Zernike polynomials for each of the pupil luminance distributions obtained about plural points on the surface to be illuminated (the image plane of the projection optical system PL) and thereby to calculate the Zernike coefficients Ci of the respective terms for each of points. Concerning the fitting technique of the pupil luminance distributions (pupil transmittance distributions) by the Zernike polynomials, reference is made to the aforementioned International Publication WO02/031570 and Japanese Patent Application Laid-Open No. 2004-126010.

In the adjustment method of the present modification example, the next step is to evaluate the pupil luminance distributions about respective points by a pupil luminance distribution polynomial as a function of the image-plane polar coordinates $(h,\alpha)$ and the pupil polar coordinates $(\rho,\theta)$, based on the coefficients Ci of the respective terms in the Zernike polynomials acquired in the approximately step S23 (S24). Specifically, the evaluation step S24 is to set the pupil luminance distribution polynomial that expresses the pupil luminance distributions about respective points as a function of the image-plane polar coordinates $(h,\alpha)$ and the pupil polar coordinates $(\rho,\theta)$. Concerning the setting of the pupil luminance distribution polynomial, reference is made to the specifications and drawings of Japanese Patent Application Laid-Open No. 2003-257812 and Japanese Patent Application No. 2004-149698.

The foregoing Applications describe the setting of an aberration polynomial that expresses the wavefront aberration of the projection optical system as a function of the image-plane polar coordinates $(h,\alpha)$ and the pupil polar coordinates $(\rho,\theta)$, and it is apparent that the pupil luminance distribution polynomial can be set by a similar technique. In this manner, the evaluation step S24 is arranged to determine the coefficients of the respective terms in the pupil luminance distribution polynomial, based on the Zernike coefficients Ci of the respective terms in the Zernike polynomials acquired in the approximation step (S23), and thus to express and evaluate the pupil luminance distributions about respective points by the pupil luminance distribution polynomial.

Specifically, as disclosed in the foregoing Applications and others, attention is focused, for example, on a Zernike function Zi of a specific term, and a coefficient of the specific term in the pupil luminance distribution polynomial is determined, for example, by the least-square method, based on an in-image-plane distribution of corresponding Zernike coefficients Ci (a distribution of coefficients Ci at respective points). Furthermore, attention is focused on a Zernike function Zi of another specific term, and a coefficient of the other term in the pupil luminance distribution polynomial is subsequently determined, for example, by the least-square method, based on an in-image-plane distribution of corresponding Zernike coefficients Ci.

In this way, the evaluation step S24 results in finally obtaining the pupil luminance distribution polynomial simultaneously expressing the in-pupil distribution and the in-image-plane distribution of pupil luminance distributions. By using the pupil luminance distribution polynomial simultaneously expressing the in-pupil distribution and the in-image-plane distribution of pupil luminance distributions in this way, it becomes feasible to analytically decompose the pupil luminance distributions and to calculate an optical adjustment solution more quickly and accurately than by the trial-and-error technique of numerical optimization with a computer. Namely, it becomes easier to capture features of the pupil luminance distribution situation by the pupil luminance distribution polynomial and it becomes easier to have a perspective on optical adjustment.

The next step S25 of designing correction filters is to determine (or calculate) the required transmittance distributions to be given to the respective adjustment films, in order to independently adjust each of the pupil luminance distributions about plural points on the surface to be illuminated and adjust the illuminance distribution on the surface to be illuminated, if necessary, so that both of the pupil luminance distributions and the illuminance distribution can be almost uniform to the desired extent. Specifically, the initial step, which is carried out according to need, is to approximate the illuminance distribution on the surface to be illuminated, which was acquired in the distribution acquisition step S21, by a Zernike polynomial as a function of the image-plane polar coordinates (h,α).

Furthermore, a transmittance distribution to be given to each correction filter is expressed, for example, by a Zernike polynomial of polar coordinates on an optical surface as an adjustment film. The following tables are prepared: a first table T21 indicating a relation between the coefficients of the respective terms in the Zernike polynomials expressing the transmittance distributions of the respective correction filters and changes in the pupil luminance distributions about respective points on the surface to be illuminated; and a second table T22 indicating a relation between the coefficients of the respective terms in the Zernike polynomials expressing the transmittance distributions of the respective correction filters and changes in the illuminance distribution on the surface to be illuminated.

In this way, the design step S25 is to determine the transmittance distributions to be given to the respective correction filters, for adjusting each of the pupil luminance distributions at respective points on the surface to be illuminated to being almost uniform, while maintaining or adjusting the illuminance distribution on the surface to be illuminated to being almost uniform, based on an optimization technique by linear coupling with reference to the evaluation result about the pupil luminance distributions acquired in the evaluation step S24 (specifically, the pupil luminance distribution polynomial simultaneously expressing the in-pupil distribution and the in-image-plane distribution of pupil luminance distributions), the illuminance distribution information approximated by the Zernike polynomials if necessary, the correlation between transmittance distributions of the respective correction filters and changes in the pupil luminance distributions in the first table T21, and the correlation between transmittance distributions of the respective correction filters and changes in the illuminance distribution in the second table T22.

The next step is to calculate the pupil luminance distributions about plural points on the surface to be illuminated and the illuminance distribution on the surface to be illuminated, in a state in which the plurality of correction filters with the transmittance distributions determined in the design step S25 are located at their respective prefigured positions, i.e., in a mounted state of the correction filters (S26). Furthermore, it is determined whether each of the pupil luminance distributions about plural points on the surface to be illuminated and the illuminance distribution on the surface to be illuminated, which were calculated in the distribution calculation step S26, is almost uniform to the desired extent (S22). Since the required transmittance distributions were readily and accurately determined by the optimization technique based on linear coupling, instead of the trial-and-error method, the determination step S22 results in determining that both of the pupil luminance distributions and the illuminance distribution are almost uniform to the desired extent, and the flow proceeds to the step S27 of determining the dot dense patterns of the correction filters.

The pattern determination step S27 is to determine the dense patterns of light-blocking dots necessary for realizing the required transmittance distributions (the transmittance distributions to be given to the respective correction filters) calculated in the design step S25. The last step is to manufacture the plurality of correction filters with the dot dense patterns determined in the pattern determination step S27, and to incorporate the manufactured correction filters at their respective predetermined positions in the optical system (S28). The adjustment method of the modification example is completed in this way.

In the above-described embodiment and modification example of the adjustment method, the application of the technique of actually measuring the pupil luminance distributions and the illuminance distribution, to the distribution acquisition step S11, S21 is extremely useful, for example, in correction for manufacturing errors of apparatus fabricated actually and in correction for temporal changes of apparatus in operation.

In each of the embodiment and modification examples as described above, the plurality of adjustment surfaces of the adjuster are not limited to those with the predetermined transmittance distributions or reflectance distributions, but another potential configuration is, for example, such that light with a light intensity distribution different from that of incident light is outputted by changing the density of rays of an incident light beam by use of diffraction of a diffractive optical element.

In each of the above-described embodiment and modification examples, the projection optical system can be the catadioptric projection optical system described in International Publication 2004/019128. It is also possible to use the catadioptric projection optical systems described in International Publication 2004/107011, International Publication 2005/59617, and U.S. Published Application No. 2005/0117224. Among these, the catadioptric projection optical systems described in the foregoing International Publication 2004/019128 and U.S. Published Application No. 2005/0117224 include one or more path folding mirrors, and if the path folding mirror causes the pupil luminance distribution on the wafer W as a surface to be illuminated, to have an inclined distribution, one or more of the plurality of adjustment surfaces of the adjuster in each of the forgoing embodiment and modification examples may be provided with a component for compensating for the inclined distribution of the pupil luminance distribution.

The exposure apparatus of the foregoing embodiment can be used to manufacture microdevices (semiconductor devices, image pickup devices, liquid-crystal display devices, thin-film magnetic heads, etc.) by illuminating a mask (reticle) by the illumination optical apparatus (illumination step) and projecting a pattern to be transferred, formed on the mask, onto a photosensitive substrate with the projection optical system (exposure step). An example of a technique of forming a predetermined circuit pattern on a wafer or the like as a photosensitive substrate with the exposure apparatus of the foregoing embodiment to obtain semiconductor devices as microdevices will be described below with reference to the flowchart of FIG. 13.

Figure 13:
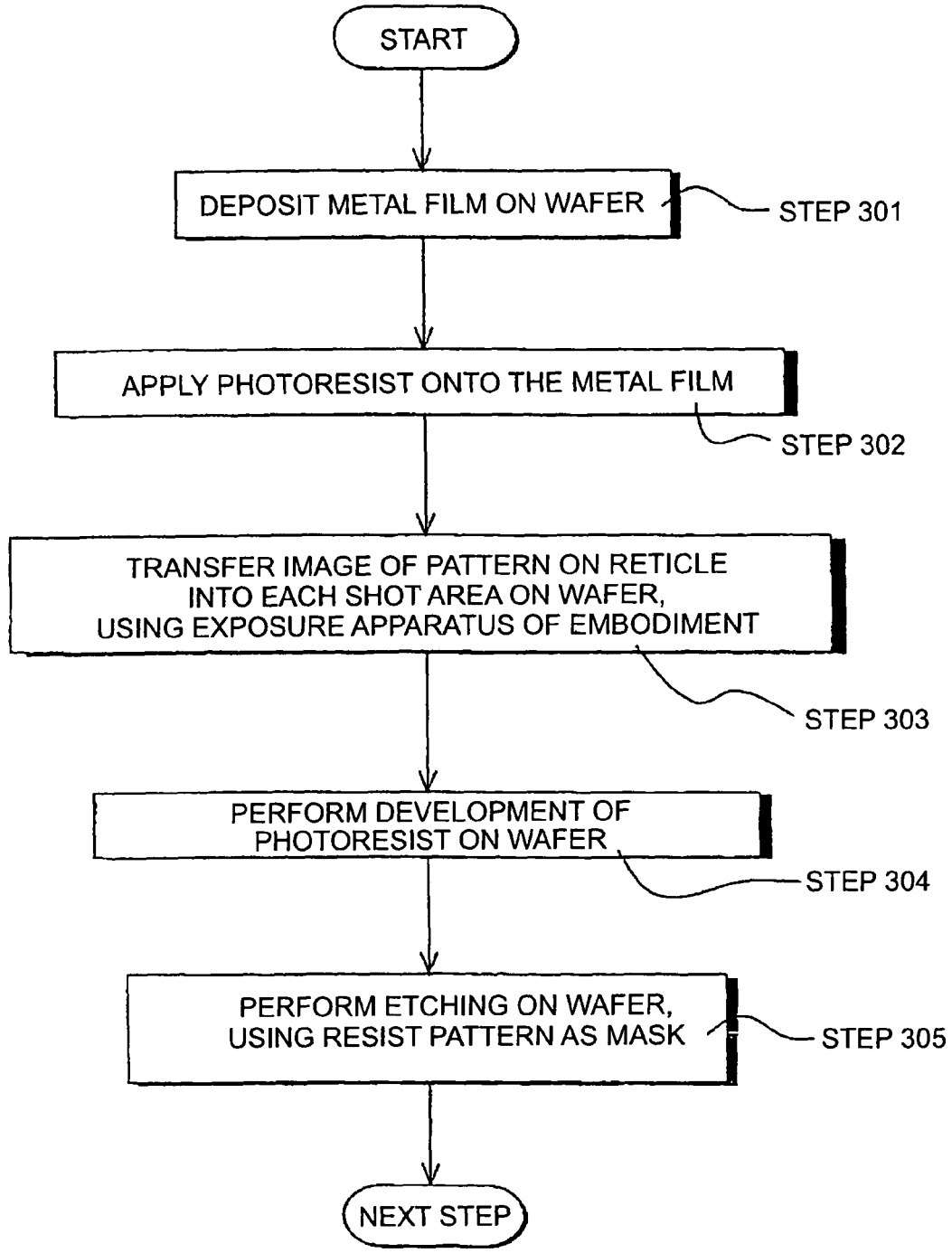
FIG. 13 is a flowchart of a technique of manufacturing semiconductor devices as microdevices.

The first step 301 in FIG. 13 is to deposit a metal film on each wafer in one lot. The next step 302 is to apply a photoresist onto the metal film on each wafer in the lot. The subsequent step 303 is to sequentially transfer an image of a pattern on the mask into each shot area on each wafer in the lot through the projection optical system, using the exposure apparatus of the foregoing embodiment. The subsequent step 304 is to perform development of the photoresist on each wafer in the lot and the subsequent step 305 is to perform etching on each wafer in the lot, using the resist pattern as a mask, and thereby to form a circuit pattern corresponding to the pattern on the mask, in each shot area on each wafer. Subsequent steps include formation of circuit patterns in upper layers, and others, thereby manufacturing devices such as semiconductor devices. The above-described semiconductor device manufacture method permits us to obtain semiconductor devices with extremely fine circuit patterns at high throughput.

Figure 14:
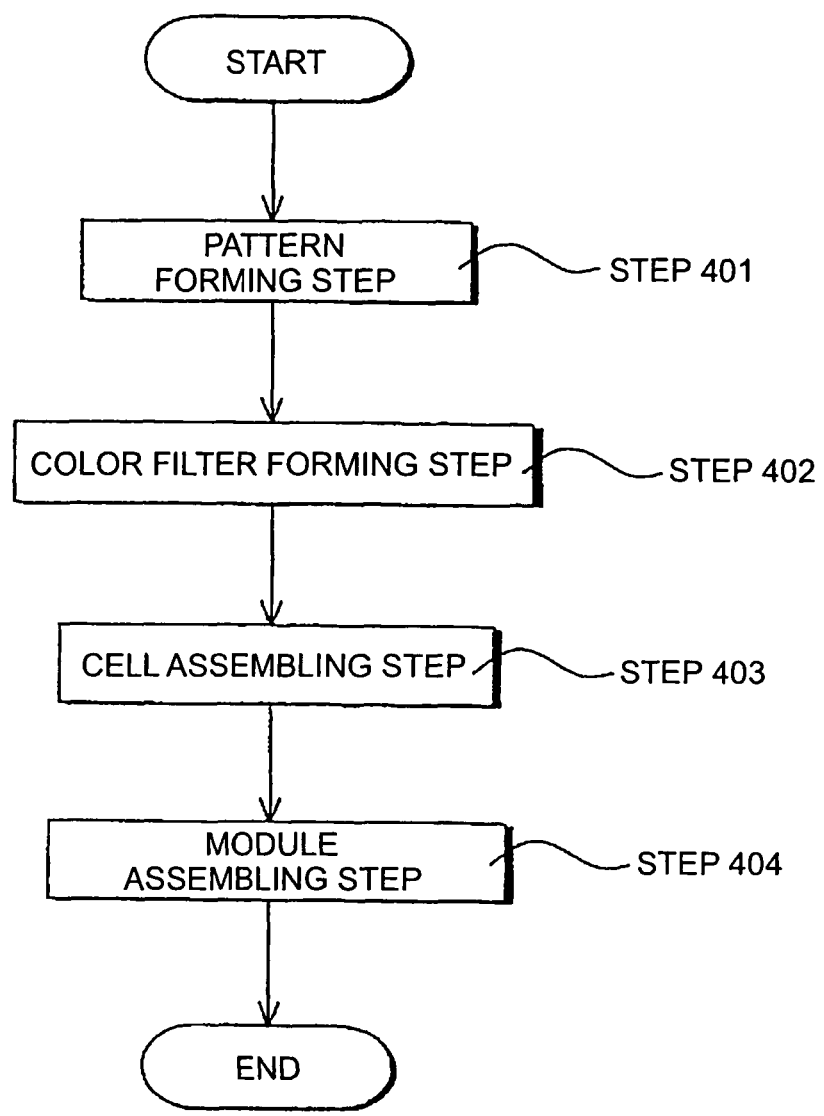
FIG. 14 is a flowchart of a technique of manufacturing a liquid-crystal display device as a microdevice.

The exposure apparatus of the foregoing embodiment can also be used to manufacture a liquid-crystal display device as a microdevice by forming predetermined patterns (circuit pattern, electrode pattern, etc.) on plates (glass substrates). An example of a technique in this case will be described with reference to the flowchart of FIG. 14. In FIG. 14, a pattern forming step 401 is to execute a so-called photolithography step to transfer a pattern of a mask onto a photosensitive substrate (glass substrate coated with a resist, or the like) with the exposure apparatus of the foregoing embodiment. This photolithography step results in forming the predetermined pattern including a number of electrodes and others on the photosensitive substrate. Thereafter, the exposed substrate is subjected to each of steps such as development, etching, and resist removal, whereby a predetermined pattern is formed on the substrate. Thereafter, the process shifts to the next color filter forming step 402.

The next color filter forming step 402 is to form a color filter in which a number of sets of three dots corresponding to R (Red), G (Green), and B (Blue) are arrayed in a matrix pattern, or in which sets of three stripe filters of R, G, and B are arrayed as a plurality of lines along the horizontal scan line direction. After completion of the color filter forming step 402, a cell assembling step 403 is carried out. The cell assembling step 403 is to assemble a liquid crystal panel (liquid crystal cell), using the substrate with the predetermined pattern obtained in the pattern forming step 401, the color filter obtained in the color filter forming step 402, and so on.

In the cell assembling step 403, for example, a liquid crystal is poured into between the substrate with the predetermined pattern obtained in the pattern forming step 401 and the color filter obtained in the color filter forming step 402, to manufacture a liquid crystal panel (liquid crystal cell). The subsequent module assembling step 404 is to install each of components such as an electric circuit, a backlight, etc. for display operation of the assembled liquid crystal panel (liquid crystal cell) to complete the liquid-crystal display device. The above-described method of manufacturing the liquid-crystal display device permits us to obtain the liquid-crystal display device with an extremely fine circuit pattern at high throughput.

In the foregoing embodiment the exposure light was the KrF excimer laser light (wavelength: 248 nm) or the ArF excimer laser light (wavelength: 193 nm), but, without having to be limited to this, the present invention can also be applied to the other appropriate laser light sources, e.g., an $F_2$ laser light source for supplying laser light of the wavelength of 157 nm. Furthermore, the aforementioned embodiment described the present invention with the example of the exposure apparatus provided with the illumination optical apparatus, but it is apparent that the present invention can be applied to the ordinary illumination optical apparatus for illuminating a surface to be illuminated, except for the masks and wafers.

In the foregoing embodiment, it is also possible to adopt a technique of filling the optical path between the projection optical system and the photosensitive substrate with a medium having the refractive index of more than 1.1 (typically, a liquid), i.e., the so-called liquid immersion method. In this case, the technique of filling the optical path between the projection optical system and the photosensitive substrate with the liquid can be one selected from the method of locally filling the space with the liquid as disclosed in International Publication WO99/49504, the method of moving a stage holding a substrate as an exposed object, in a liquid bath as disclosed in Japanese Patent Application Laid-Open No. 6-124873, the method of forming a liquid bath in a predetermined depth on a stage and holding a substrate in the liquid bath as disclosed in Japanese Patent Application Laid-Open No. 10-303114, and so on.

The liquid is preferably one that is transparent to the exposure light, that has the refractive index as high as possible, and that is stable against the projection optical system and the photoresist applied on the surface of the substrate; for example, where the KrF excimer laser light or the ArF excimer laser light is used as the exposure light, the liquid can be pure water, deionized water, glycerol ($CH_2[OH]CH[OH]CH_2[OH]$), heptane ($C_7H_{16}$), water with $H^+$, $Cs^-$, $K^+$, $Cl^-$, $SO_4^{2-}$, or $PO_4^{2-}$, water mixed with fine particles of aluminum oxide, isopropanol, hexane, decane, or the like. Where the exposure light is the $F_2$ laser light, the liquid can be a fluorine-based liquid, for example, such as fluorine oil or perfluoro polyether (PFPE) capable of transmitting the $F_2$ laser light.

DESCRIPTION OF REFERENCE SYMBOLS 1 light source
3 diffractive optical element
4 zoom lens
5 micro fly's eye lens (fly's eye lens)
6 condenser optical system
7 mask blind
8, 8a, 9, 9a correction filters
10 imaging optical system
20 distribution measuring device
25 illuminance measuring device
M mask
MS mask stage
PL projection optical system
W wafer
WS wafer stage

The invention claimed is:

1. An illumination optical apparatus which illuminates a surface to be illuminated, with illumination light,
the illumination optical apparatus comprising:
an optical integrator which is arranged in an optical path of the illumination light, which forms a pupil intensity distribution by distributing the illumination light on an illumination pupil plane, which has a plurality of optical surfaces arranged along a plane which intersects the illumination light;
a condenser optical system which is arranged between the optical integrator and the surface to be illuminated, and which condenses the illumination light from the illumination pupil plane on the surface to be illuminated, an optically conjugate plane of the surface to be illuminated positioned in an optical path of the condenser optical system;
a first adjustment surface disposed in an optical path between the optical integrator and the optically conjugate plane; and
a second adjustment surface disposed in the optical path between the optically conjugate plane and the surface to be illuminated,
wherein a transmittance distribution of each of the first and second adjustment surfaces either monotonically increases or monotonically decreases towards a periphery of the respective first and second adjustment surfaces in accordance with a quadratic function of distance from a center of the respective first and second adjustment surfaces.

2. An illumination optical apparatus according to claim 1, wherein each of the first and second adjustment surfaces outputs light with a light intensity distribution different from a light intensity distribution of incident light, and
wherein a change of light intensity distribution imposed by passage of a first light beam through the first and second adjustment surfaces is different from a change of light intensity distribution imposed by passage of a second light beam through the first and second adjustment surfaces.

3. An illumination optical apparatus according to claim 1, wherein the first and second adjustment surfaces are located at respective positions different from each other along an optical-axis direction of the illumination optical apparatus.

4. An illumination optical apparatus according to claim 1, wherein the first adjustment surface has a first transmittance distribution or a first reflectance distribution of transmittances or reflectances different according to incidence angles; and
the second adjustment surface has a second transmittance distribution or a second reflectance distribution substantially complementary to the first transmittance distribution or the first reflectance distribution.

5. An illumination optical apparatus according to claim 1, wherein a light beam size at a location where a light beam to arrive at a predetermined point on the surface to be illuminated passes through the first adjustment surface is different from a light beam size at a location where the light beam to arrive at the predetermined point on the surface to be illuminated passes through the second adjustment surface.

6. An exposure apparatus comprising the illumination optical apparatus according to claim 1, the exposure apparatus being adapted for projecting a pattern of a mask illuminated by the illumination optical apparatus, onto a photosensitive substrate to effect exposure thereof.

7. An exposure apparatus according to claim 6, further comprising a projection optical system for forming an image of the pattern of the mask on the photosensitive substrate, wherein the surface to be illuminated is an image plane of the projection optical system.

8. An exposure apparatus according to claim 6, wherein a surface of the pattern of the mask is located on the surface to be illuminated.

9. An illumination optical apparatus according to claim 1, wherein the first and second adjustment surfaces are disposed on an optical axis of the illumination optical apparatus.

10. An illumination optical apparatus which distributes light from a light source and which illuminates a surface to be illuminated,
the illumination optical apparatus comprising:
a first adjustment surface having a first transmittance distribution or a first reflectance distribution of transmittances or reflectances different according to incidence positions; and
a second adjustment surface having a second transmittance distribution or a second reflectance distribution substantially complementary to the first transmittance distribution or the first reflectance distribution;
wherein the first and second adjustment surfaces are located at respective positions different from each other along an optical-axis direction of the illumination optical apparatus,
wherein the first adjustment surface is located on the light source side with respect to a conjugate plane optically conjugate with the surface to be illuminated,
wherein the second adjustment surface is located on the surface-to-be-illuminated side with respect to the conjugate plane, and
wherein the transmittance distribution or the reflectance distribution of each of the first and second adjustment surfaces either monotonically increases or monotonically decreases towards a periphery of the respective first and second adjustment surfaces in accordance with a quadratic function of distance from a center of the respective first and second adjustment surfaces.

11. An illumination optical apparatus according to claim 10, wherein the first and second adjustment surfaces adjust an illuminance distribution on the surface to be illuminated, according to a difference between the complementary transmittance distribution or reflectance distribution and the second transmittance distribution or the second reflectance distribution.

12. An illumination optical apparatus according to claim 11, wherein a distance between the first adjustment surface and the conjugate plane is substantially equal to a distance between the second adjustment surface and the conjugate plane.

13. An illumination optical apparatus according to claim 10, wherein the first adjustment surface has the first transmittance distribution or the first reflectance distribution of transmittances or reflectances different according to incidence positions; and the second adjustment surface has the second transmittance distribution or the second reflectance distribution of transmittances or reflectances different according to incidence angles.

14. An illumination optical apparatus according to claim 10, wherein each of the adjustment surfaces is formed on a plane of an optical member having said plane.

15. An exposure apparatus comprising the illumination optical apparatus according to claim 10, the exposure apparatus being adapted for projecting a pattern of a mask illuminated by the illumination optical apparatus, onto a photosensitive substrate to effect exposure thereof.

16. An exposure apparatus according to claim 15, further comprising a projection optical system for forming an image of the pattern of the mask on the photosensitive substrate, wherein the surface to be illuminated is an image plane of the projection optical system.

17. An exposure apparatus according to claim 15, wherein a surface of the pattern of the mask is located on the surface to be illuminated.

18. An illumination optical apparatus according to claim 10, wherein the first and second adjustment surfaces are disposed on an optical axis of the illumination optical apparatus.

19. An illumination optical apparatus for illuminating a surface to be illuminated, with a light beam from a light source,
the illumination optical apparatus comprising:
a first adjustment surface disposed in an optical path between an illumination pupil plane of the illumination optical apparatus and the surface to be illuminated and in an optical path on the light source side with respect to a conjugate plane optically conjugate with the surface to be illuminated, and having a first transmittance distribution or a first reflectance distribution of transmittances or reflectances different according to incidence positions; and
a second adjustment surface disposed in the optical path between the illumination pupil plane and the surface to be illuminated and in an optical path on the surface-to-be-illuminated side with respect to the conjugate plane optically conjugate with the surface to be illuminated, and having a second transmittance distribution or a second reflectance distribution of transmittances or reflectances different according to incidence positions,
wherein the transmittance distribution or the reflectance distribution of each of the first and second adjustment surfaces either monotonically increases or monotonically decreases towards a periphery of the respective first and second adjustment surfaces in accordance with a quadratic function of distance from a center of the respective first and second adjustment surfaces.

20. An illumination optical apparatus according to claim 19, wherein the second transmittance distribution or the second reflectance distribution is substantially complementary to the first transmittance distribution or the first reflectance distribution.

21. An illumination optical apparatus according to claim 19, wherein the second transmittance distribution or the second reflectance distribution is substantially different from a transmittance distribution or reflectance distribution substantially complementary to the first transmittance distribution or the first reflectance distribution.

22. An illumination optical apparatus according to claim 19, wherein the first and second adjustment surfaces are disposed on an optical axis of the illumination optical apparatus.

23. An illumination optical apparatus for illuminating a surface to be illuminated, with a light beam from a light source,
the illumination optical apparatus comprising:
a first adjustment surface disposed in an optical path between an illumination pupil plane of the illumination optical apparatus and the surface to be illuminated, and on a first plane crossing the optical path, and having a first transmittance distribution or a first reflectance distribution of transmittances or reflectances different according to incidence positions in the first plane;
an optical member disposed on an optical path between the first adjustment surface and the surface to be illuminated; and
a second adjustment surface disposed in the optical path between the optical member and the surface to be illuminated, and in a second plane crossing the optical path, and having a second transmittance distribution or a second reflectance distribution of transmittances or reflectances different according to incidence positions; wherein
a light beam size at a location where a light beam to arrive at a predetermined point on the surface to be illuminated passes through the first adjustment surface is different from a light beam size at a location where the light beam to arrive at the predetermined point on the surface to be illuminated passes through the second adjustment surface,
the first and second planes are formed parallel with respect to each other, and
the transmittance distribution or the reflectance distribution of each of the first and second adjustment surfaces either monotonically increases or monotonically decreases towards a periphery of the respective first and second adjustment surfaces in accordance with a quadratic function of distance from a center of the respective first and second adjustment surfaces.

24. An illumination optical apparatus according to claim 23, wherein the optical member comprises a lens.

25. An exposure apparatus comprising the illumination optical apparatus according to claim 23, the exposure apparatus being adapted for projecting a pattern of a mask illuminated by the illumination optical apparatus, onto a photosensitive substrate to effect exposure thereof.

26. An exposure apparatus according to claim 25, further comprising a projection optical system for forming an image of the pattern of the mask on the photosensitive substrate, wherein the surface to be illuminated is an image plane of the projection optical system.

27. An exposure apparatus according to claim 25, wherein a surface of the pattern of the mask is located on the surface to be illuminated.

28. An illumination optical apparatus according to claim 23, wherein the first and second adjustment surfaces are disposed on an optical axis of the illumination optical apparatus.

* * * * *